US010585467B2

(12) United States Patent
Moon et al.

(10) Patent No.: US 10,585,467 B2
(45) Date of Patent: Mar. 10, 2020

(54) ELECTRONIC DEVICE FOR CHARGING BATTERY BY USING TERMINAL EXPOSED TO OUTSIDE AND OPERATION METHOD THEREOF

(71) Applicant: Samsung Electronics Co., Ltd., Gyeonggi-do (KR)

(72) Inventors: Jung-Pil Moon, Gyeonggi-do (KR); Jee-Hoon Lee, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/123,151

(22) Filed: Sep. 6, 2018

(65) Prior Publication Data

US 2019/0073009 A1 Mar. 7, 2019

(30) Foreign Application Priority Data

Sep. 6, 2017 (KR) .................. 10-2017-0114046

(51) Int. Cl.
*H01M 10/46* (2006.01)
*G06F 1/26* (2006.01)
(Continued)

(52) U.S. Cl.
CPC ......... *G06F 1/263* (2013.01); *G01R 31/3835* (2019.01); *G06F 1/163* (2013.01);
(Continued)

(58) Field of Classification Search
CPC ........ H02J 7/355; H02J 7/0042; H02J 7/0036; H02J 7/0034; H02J 7/0045
(Continued)

(56) References Cited

U.S. PATENT DOCUMENTS 5,072,167 A 12/1991 Zias
9,276,625 B2 3/2016 Jing et al.
(Continued)

FOREIGN PATENT DOCUMENTS

KR 10-2013-0044139 A 5/2013

OTHER PUBLICATIONS

European Search Report dated Jan. 25, 2019.

*Primary Examiner* — Edward Tso
(74) *Attorney, Agent, or Firm* — Cha & Reiter, LLC.

(57) ABSTRACT

A wearable device according to an embodiment disclosed herein may include: a housing forming at least a part of an exterior of the wearable device; a battery disposed in the housing and including a positive electrode terminal and a negative electrode terminal; a connection terminal part, at least a part of which is exposed through at least a part of the housing and including a first terminal and a second terminal; a bridge circuit configured to, based on a polarity of a first voltage applied to the first terminal, electrically connect the first terminal to one of the positive electrode terminal and the negative electrode terminal having polarity corresponding to the polarity of the first voltage, and based on a polarity of a second voltage applied to the second terminal, electrically connect the second terminal to one of the positive electrode terminal and the negative electrode terminal having polarity corresponding to the polarity of the second voltage; a sensor module configured to obtain bio-information; and a switch circuit configured to selectively connect the connection terminal part with the bridge circuit and the sensor module.

20 Claims, 18 Drawing Sheets

(51) Int. Cl.
*H01M 10/04* (2006.01)
*H01M 2/30* (2006.01)
*G06F 1/16* (2006.01)
*H01M 2/10* (2006.01)
*H01M 10/48* (2006.01)
*G01R 31/3835* (2019.01)
*H02J 7/00* (2006.01)

(52) U.S. Cl.
CPC ........... *H01M 2/1022* (2013.01); *H01M 2/30* (2013.01); *H01M 10/045* (2013.01); *H01M 10/48* (2013.01); *H02J 7/0034* (2013.01); *H02J 7/0044* (2013.01)

(58) Field of Classification Search
USPC .................... 320/107, 114, 115, 132, 165
See application file for complete search history.

(56) References Cited

U.S. PATENT DOCUMENTS

| | | | |
|---|---|---|---|
| 2005/0196003 A1 | 9/2005 | Fluit | |
| 2014/0247155 A1* | 9/2014 | Proud | H04W 4/70 340/870.16 |
| 2016/0099613 A1* | 4/2016 | Bell | H02J 7/025 307/104 |
| 2016/0284961 A1* | 9/2016 | Alhawari | H01L 35/28 |
| 2017/0054290 A1 | 2/2017 | Di et al. | |
| 2017/0054308 A1 | 2/2017 | Olah et al. | |
| 2017/0063107 A1 | 3/2017 | Lee et al. | |
| 2018/0120892 A1* | 5/2018 | von Badinski | G06F 3/1423 |

\* cited by examiner

| STATE 1 | STATE 2 | EB | S1 | S2 |
|---------|---------|----|----|----|
| 0 | 0 | 0 | 0 | 0 |
| 1 | 0 | 0 | 0 | 0 |
| 0 | 1 | 0 | 0 | 0 |
| 1 | 0 | 1 | 1 | 0 |
| 0 | 1 | 1 | 0 | 1 |

FIG.12

ELECTRONIC DEVICE FOR CHARGING BATTERY BY USING TERMINAL EXPOSED TO OUTSIDE AND OPERATION METHOD THEREOF

CROSS-REFERENCE TO RELATED APPLICATION

This application is based on and claims the priority under 35 U.S.C. § 119(a) to Korean Patent Application Serial No. 10-2017-0114046, which was filed in the Korean Intellectual Property Office on Sep. 6, 2017, the entire content of which is hereby incorporated by reference.

TECHNICAL FIELD

Various embodiments disclosed herein generally relate to an electronic device for charging its battery by using an exposed terminal and an operation method thereof.

BACKGROUND

Recently, wearable devices which can be worn on the user's body have been developed. The user can operate the wearable devices to perform various functions.

The wearable device may include a battery for supplying power. To charge the battery, an electrode of the wearable device and an electrode of a charger can be connected to each other.

When the wearable device is being charged, the wearable device and the charger should be connected by electrodes having the same polarity in order to prevent the wearable device from being damaged by a short-circuit. To ensure that electrodes of the same polarity are connected, the wearable device may be required to connect to the charger in a certain orientation. But this may be inconvenient to the user because he or she must properly orient the wearable device and the charger in order to initiate charging.

In addition, when a separate electrode is added to the wearable device and the charger, various orientations are allowed when the wearable device is connected to the charger. However, in such circumstances, there is a possibility that unless the wearable device and the charger are completely fixed to each other, the wearable device may be damaged by a short-circuit caused by an external impact.

SUMMARY

Various embodiments disclosed herein may provide an electronic device. The electronic device and a charger can be connected regardless of the polarity of the charger. An operation method thereof is also disclosed.

A wearable device according to an embodiment may include: a housing forming at least a part of an exterior of the wearable device; a battery disposed in the housing and including a positive electrode terminal and a negative electrode terminal; a connection terminal part, at least a part of which is exposed through at least a part of the housing, and including a first terminal and a second terminal; a bridge circuit configured to, based on a polarity of a first voltage applied to the first terminal, electrically connect the first terminal to one of the positive electrode terminal and the negative electrode terminal having polarity corresponding to the polarity of the first voltage, and based on a polarity of a second voltage applied to the second terminal, electrically connect the second terminal to one of the positive electrode terminal and the negative electrode terminal having polarity corresponding to the polarity of the second voltage; a sensor module configured to obtain bio-information; and a switch circuit configured to selectively connect the connection terminal part with the bridge circuit and the sensor module.

An electronic device according to an embodiment may include: a housing forming at least a part of an exterior of the electronic device; a battery disposed in the housing and including a positive electrode terminal and a negative electrode terminal; a connection terminal part, at least a part of which is exposed through at least a part of the housing and including a first terminal and a second terminal; and a bridge circuit configured to, based on a polarity of a first voltage applied to the first terminal, electrically connect the first terminal to one of the positive electrode terminal and the negative electrode terminal having polarity corresponding to the polarity of the first voltage, based on a polarity of a second voltage applied to the second terminal, electrically connect the second terminal to one of the positive electrode terminal and the negative electrode terminal having polarity corresponding to the polarity of the second voltage.

An operation method of an electronic device according to an embodiment may include: determining whether to a request to charge the electronic device or a request to obtain bio-information by using the electronic device is received; when the request to obtain the bio-information is received, controlling a switch circuit so as to connect a connection terminal part of the electronic device to a sensor module; when the request to charge the electronic device is received, controlling the switch circuit so as to connect the connection terminal part of the electronic device to a charging circuit; when the request to charge the electronic device is received, through a bridge circuit of the charging circuit and based on a polarity of a first voltage applied to a first terminal of the connection terminal part, electrically connecting the first terminal of the connection terminal part to one of a positive electrode terminal and a negative electrode terminal of a battery having polarity corresponding to the polarity of the first voltage, wherein the battery is included in the electronic device; and when the request to charge the electronic device is received, through a bridge circuit of the charging circuit and based on a polarity of a second voltage applied to a second terminal of the connection terminal part, electrically connecting the second terminal of the connection terminal part to one of the positive electrode terminal and the negative electrode terminal having polarity corresponding to the polarity of the second voltage.

Electronic devices according to various embodiments can charge their batteries by connecting to chargers regardless of the polarities of the chargers.

In addition, electronic devices according to various embodiments can connect to chargers without having to be in a particular orientation with respect to the chargers.

BRIEF DESCRIPTION OF THE DRAWINGS

The above and other aspects, features, and advantages of the present disclosure will be more apparent from the following detailed description taken in conjunction with the accompanying drawings, in which:

FIG. 12 is a table showing correlation between various signals for controlling a switch according to an embodiment;

DETAILED DESCRIPTION

Figure 1:
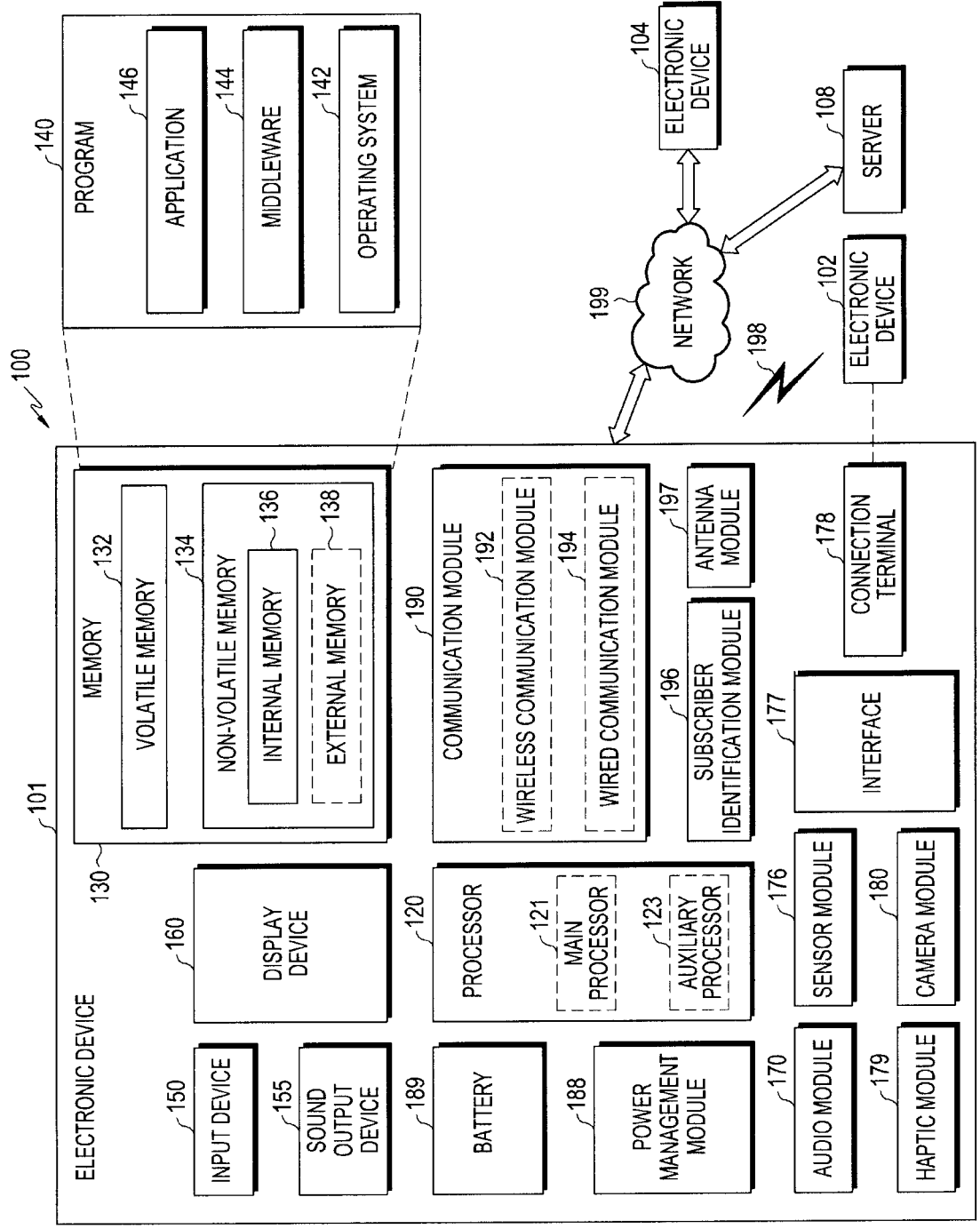
FIG. 1 is a block diagram of an electronic device in a network environment, according to an embodiment.

FIG. 1 a block diagram of an electronic device 101 in a network environment 100, according to an embodiment. Referring to FIG. 1, the electronic device 101 in the network environment 100 may communicate with an electronic device 102 through a first network (e.g. short-range wireless communication) or may communicate with an electronic device 104 or a server 108 through a second network 199 (e.g. long-range wireless communication). According to an embodiment, the electronic device 101 may communicate with the electronic device 104 through the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module 196, and an antenna module 197. In an embodiment, at least one (e.g. the display device 160 or the camera module 180) among the elements may be omitted from the electronic device 101, or another element may be added thereto. In an embodiment, for example, some elements may be integrally implemented like the sensor module 176 (e.g. a fingerprint sensor, an iris sensor, or an illuminance sensor) embedded in the display device 160 (e.g. a display).

The processor 120 may, for example, drive software (e.g. a program 140) to control at least one other element (e.g. hardware or software element) of the electronic device 101 connected to the processor 120 and may variously process and calculate data. The processor 120 may load command or data received from another element (e.g. the sensor module 176 or the communication module 190) on a volatile memory 132 and process the loaded command or data, and may store resultant data in a non-volatile memory 134. According to an embodiment, the processor 120 may include a main processor 121 (e.g. a central processing unit or an application processor), and an auxiliary processor 123 (e.g. a graphic processor unit, an image signal processor, a sensor hub processor, or a communication processor) that operates independently therefrom, and additionally or alternatively, uses less power than the main processor 121, or specializes in a designated function. The auxiliary processor 123 may operate separately from the main processor 121 or in the state where the auxiliary processor 123 has been embedded in the main processor 121. The processor 120 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. § 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

In this case, the auxiliary processor 123 may, for example, control at least some of states or functions related to at least one element (e.g. the display device 160, the sensor module 176, or the communication module 190) among the elements of the electronic device 101, on behalf of the main processor 121 while the main processor 121 is in an inactive (e.g. sleep) state, or together with the main processor 121 while the main processor 121 is in an active (e.g. performing an application) state. According to an embodiment, the auxiliary processor 123 (e.g. an image signal processor or a communication processor) may be implemented as a partial element of another element (e.g. the camera module 180 or the communication module 190) functionally related thereto. The memory 130 may store various pieces of data (e.g. software (e.g. the program 140) and input data or output data about a command relating to the software) used by at least one element (e.g. the processor 120 or the sensor module 176) of the electronic device 101. The memory 130 may include the volatile memory 132 or the non-volatile memory 134.

The program 140 is software stored in the memory 130 and may include, for example, an operating system 142, middleware 144, or an application 146.

The input device 150 is a device configured to receive a command or data to be used in an element (e.g. the processor 120) of the electronic device 101 from the outside (e.g. a user) of the electronic device 101 and may include, for example, a microphone, a mouse, or a keyboard.

The sound output device 155 is a device configured to output a sound signal to the outside of the electronic device 101 and may include, for example, a speaker used for common use, such as multimedia content reproduction or recording reproduction, and a receiver used for only phone call reception. According to an embodiment, the receiver may be arranged integrally with the speaker or separately therefrom.

The display device 160 is a device configured to visually provide a user of the electronic device 101 with information and may include, for example, a display, a hologram device, or a projector, and a control circuit configured to control the corresponding device. According to an embodiment, the display device 160 may include a touch circuit (touch circuitry) or a pressure sensor configured to measure the pressure intensity of a touch.

The audio module 170 may convert sound into electronic signals or vice versa. According to an embodiment, the audio module 170 may acquire sound through the input device 150 or may output sound through the sound output device 155 or an external electronic device (e.g. the electronic device 102 (e.g. speaker or headphone)) connected with the electronic device 101 by wire or wirelessly.

The sensor module 176 may generate an electrical signal or a data value corresponding to the internal operation state (e.g. power or temperature) or the external environment state of the electronic device 101. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support a designated protocol allowing wireless or wired connection with an external electronic device (e.g. the electronic device 102). According to an embodiment, the interface 177 may include a High Definition Multimedia Interface (HDMI), a Universal Serial Bus (USB) interface, an SD card interface, or an audio interface.

A connection terminal 178 may include a connecter, for example, an HDMI connector, a USB connector, an SD card connector, or an audio connector (e.g. headphone connector), that can physically connect the electronic device 101 and an external electronic device (e.g. the electronic device 102).

The haptic module 179 may convert an electronic signal into an electrical stimulus or a mechanical stimulus (e.g. vibration or movement) that a user can recognize through haptic or kinetic sensation. The haptic module 179 may include, for example, a motor, a piezoelectric element, or an electrical stimulation device.

The camera module 180 may photograph a still image and a moving image. According to an embodiment, the camera module 180 may include at least one lens, an image sensor, an image signal processor, or a flash.

The power management module 188 is a module configured to manage power supplied to the electronic device 101 and, for example, may be configured as at least a part of a Power Management Integrated Circuit (PMIC).

The battery 189 is a device configured to supply power to at least one element of the electronic device 101 and, for example, may include a non-rechargeable primary battery, a rechargeable secondary battery, or a fuel battery.

The communication module 190 may support establishment of a wired or wireless communication channel between the electronic device 101 and an external electronic device (e.g. the electronic device 102, the electronic device 104, or the server 108) and communication through the established communication channel. The communication module 190 may include at least one communication processor that supports wired communication or wireless communication and operates independently from the processor 120 (e.g. an application processor). According to an embodiment, the communication module 190 may include a wireless communication module 192 (e.g. a cellular communication module, a short-range wireless communication module, or a Global Navigation Satellite System (GNSS) communication module) or a wired communication module 194 (e.g. a Local Area Network (LAN) communication module or a power line communication module) and may communicate with an external electronic device through the first network 198 (e.g. a short-range communication network, such as Bluetooth, Wi-Fi direct or Infrared Data Association (IrDA)) or the second network 199 (e.g. a long-range communication network, such as a cellular network, Internet, or a computer network (e.g. LAN or WAN)), by using a corresponding communication module among the communication modules. The various kinds of communication modules 190 as described above may be implemented by a single chip or respective separate chips.

According to an embodiment, the wireless communication module 192 may use user information stored in the subscriber identification module 196 to distinguish and authenticate the electronic device 101 in a communication network.

The antenna module 197 may include at least one antenna configured to receive or transmit a signal or power from or to the outside. According to an embodiment, the communication module 190 (e.g. the wireless communication module 192) may transmit or receive a signal to or from an external electronic device through an antenna suitable for a communication scheme.

Some elements among the above elements are connected to each other through an inter-peripheral device communication scheme (e.g. a bus, General Purpose Input/Output (GPIO), a Serial Peripheral Interface (SPI), or a Mobile Industry Processor Interface (MIPI)) and thus may exchange a signal (e.g. command or data) with each other.

According to an embodiment, command or data may be transmitted or received between the electronic device 101 and the external electronic device 104 through the server 108 connected to the second network 199. Each of the electronic devices 102 and 104 may be a device having a type identical to or different from the type of the electronic device 101. According to an embodiment, all or some of operations executed in the electronic device 101 may be executed by another external electronic device or a plurality of external electronic devices. According to an embodiment, when the electronic device 101 should perform a function or a service automatically or by a request, the electronic device 101 may request an external electronic device to perform at least some functions associated therewith, instead of or in addition to executing the function or the service by itself. The external electronic device that has received the request may perform the requested function or additional functions, and transfer the result therefrom to the electronic device 101. The electronic device 101 may provide the requested function or service by processing the received result as it is or additionally. To this end, for example, cloud computing, distributed computing, or client-server computing technology may be used.

The electronic device according to various embodiments disclosed herein may be various types of devices. The electronic device may, for example, include at least one of a portable communication device (e.g., smartphone) a computer device, a portable multimedia device, a portable medical device, a camera, a wearable device, and a home appliance. The electronic device according to one embodiment in the present disclosure is not limited to the above described devices.

The various embodiments disclosed in the present disclosure and the terms used therein are not intended to limit the technology disclosed herein to specific forms, and should be understood to include various modifications, equivalents, and/or alternatives to the corresponding embodiments. In describing the drawings, similar reference numerals may be used to designate similar elements. A singular expression may include the corresponding plural expression unless the context clearly indicates otherwise. In the present disclosure, the terms "A or B," "one or more of A and/or B," "A, B, or C," or "one or more of A, B and/or C" may include all possible combinations of A, B, and/or C. The expression "a first," "a second," "the first," or "the second" may refer to corresponding components without implying an order of importance, and are used merely to distinguish each component from the others without unduly limiting the components. When an element (e.g. first element) is referred to as being "(functionally or communicatively) connected" to another element (e.g. second element), the element may be connected to the other element through yet another element (e.g. third element). On the other hand, if an element (e.g. first element) is referred to as being "directly coupled" to another element (e.g. second element), the element may be connected directly to the other element without an intervening element (e.g. third element).

The term "module" as used herein may include a unit consisting of hardware, software, or firmware, and may, for example, be used interchangeably with the term "logic," "logical block," "component," "circuit," or the like. The "module" may be an integrated component, or a part thereof for performing the prescribed functions. For example, a module may be implemented by an Application-Specific Integrated Circuit (ASIC).

Various embodiments as described herein may be implemented by software (e.g. program 140) including instruction(s) stored in machine-readable storage media (e.g. internal memory 136 or external memory 138). The machine is a device that calls the stored instruction(s) from the storage media and can operate according to the called instruction(s), and may include an electronic device (e.g. electronic device 101) according to the disclosed embodiments. The command(s), when executed by a processor (e.g., processor 120), may cause the processor to directly execute a function corresponding to the command(s) or cause other elements to execute the function under the control of the processor. The command(s) may include code made by a compiler or code executable by an interpreter. The machine-readable storage media may be provided in the form of non-transitory storage media. Here, the term "non-transitory" only means that the storage media is tangible, i.e. not a signal, and is irrespective of whether data is semi-permanently or transitorily stored in the storage media.

According to an embodiment, methods according to various embodiments disclosed herein may be provided in the state where the method is included in a computer program product. The computer program product is a merchandise which can be traded between a seller and a buyer. The computer program product may be distributed in a type of machine-readable storage media (e.g. a Compact Disc Read Only Memory (CD-ROM)), or may be distributed through an application store (e.g. the Play Store™) to the online. In case of the online distribution, at least a part of the computer program product may be temporarily produced or at least transitorily stored in storage media, such as a memory of an intermediate server, a server of the application store, or a server of the manufacturer.

Each of the elements (e.g. module or program) according to various embodiments may be configured by a single or multiple entities, and some sub-elements among the above described sub-elements may be omitted, or other sub-elements may be further included in the various embodiments. Alternatively or additionally, some elements (e.g. module or program) may be integrated into a single entity and may perform identically or similarly the functions performed by the respective corresponding elements before being integrated. Operations performed by a module, a program, or other elements according to various embodiments may be executed sequentially, in parallel, repeatedly, or in a heuristic manner. At least some operations may be executed according to a sequence that is different from the one disclosed herein, may be omitted, or may further include other operations.

Figure 2:
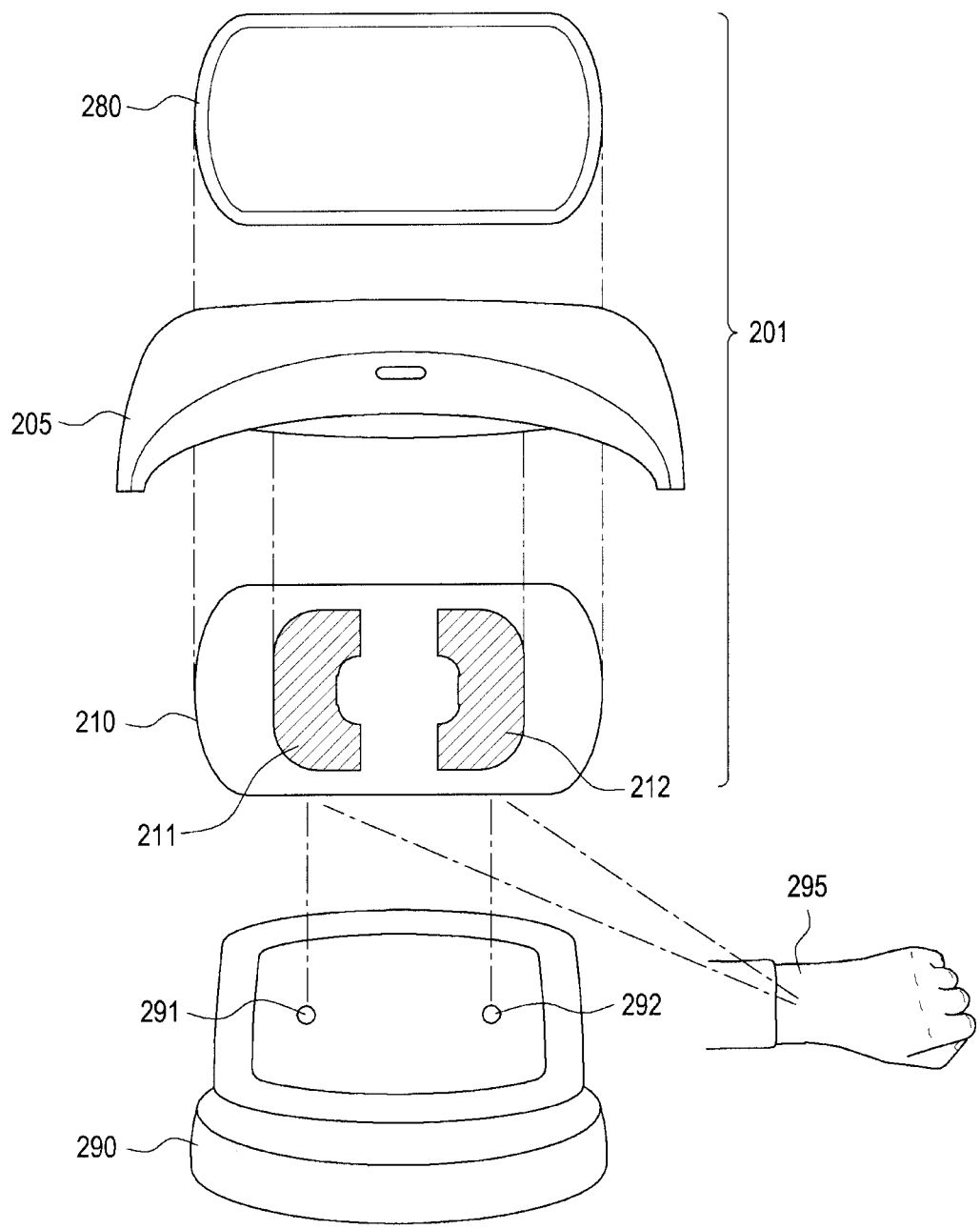
FIG. 2 is a block diagram schematically illustrating an electronic system according to an embodiment.

FIG. 2 is a block diagram schematically illustrating an electronic device according to an embodiment.

Referring to FIG. 2, an electronic device 201 (e.g. the electronic device 101 in FIG. 1) may include a housing 205, a connection terminal part 210, and a display 280 (e.g. the display device 160 in FIG. 1).

According to an embodiment, the electronic device 201 may be a wearable device.

The housing 205 may constitute the exterior of the electronic device 201. For example, the housing 205 may be implemented to protect the electronic component included therein against external forces. The electronic device 201 for example may be worn (e.g. worn on the wrist of a user) by the user.

The electronic device 201 may include a mainboard, a processor (e.g. the processor 120 in FIG. 1), a battery (e.g. the battery 189 in FIG. 1), and other electronic components in the housing 205. In one embodiment, the housing 205 may include a processor, a power management circuit (PMIC, e.g. the power management module 188 in FIG. 1), a memory (e.g. the memory 130 in FIG. 1), a communication module (e.g. the communication module 190 in FIG. 1), a mainboard, a charging circuit, a sensor module (e.g. the sensor module 176 in FIG. 1), and a battery. Also, the electronic device 201 may further include at least one button (e.g. the input device 150 in FIG. 1) configured to control the electronic device 201. The button may be exposed through the housing 205.

The connection terminal part 210 may include a terminal configured to connect an external terminal to electronic components in the housing 205. For example, a part of the connection terminal part 210 may be exposed through the housing 205.

According to an embodiment, the connection terminal part 210 may include a first terminal 211 and a second terminal 212. For example, the first terminal 211 and the second terminal 212 may be implemented with conductive materials. The terminals may also be resistant to external impact.

According to an embodiment, the electronic device 201 may be connected to a charger 290 through the first terminal 211 and the second terminal 212. For example, the first terminal 211 and the second terminal 212 may receive power applied through the charger 290 (e.g. the electrodes 291 and 292 of the charger) connected thereto.

According to an embodiment, the electronic device 201 may come into contact with a user body 295 through the first terminal 211 and the second terminal 212. For example, the first terminal 211 and the second terminal 212 may obtain a bio-signal corresponding to bio-information of the user through the user body 295 in contact therewith. For example, bio-information may include information relating to the user's Body Impedance Analysis (BIA), Photoplethysmogram (PPG), Electrocardiography (ECG), and Galvanic Skin Response (GSR).

The display 280 may display information relating to the operations of the electronic device 201. For example, the display 280 may display information relating to a particular function of the electronic device 201.

The display 280 is illustrated as an element separate from the housing 205, but the embodiments are not limited thereto, and the display 280 may be included in the housing 205. Also, the electronic device 201 may not include the display 280.

The charger 290 may charge the electronic device 201 with electrical power. For example, the charger 290 may transmit power to the electronic device 201 non-wirelessly, i.e. through a positive electrode 291 and a negative electrode 292.

According to an embodiment, the charger 290 may include the positive electrode 291 and the negative electrode 292. The charger 290 may connect the positive electrode 291 and the negative electrode 292 to the first terminal 211 and the second terminal 212 of the electronic device 201, respectively, to transmit power.

According to an embodiment, the charger 290 may connect the positive electrode 291 and the negative electrode 292 to the second terminal 212 and the first terminal 211 of the electronic device 201, respectively, to transmit power. That is, the charger 290 may charge the electronic device 201 regardless of the orientation of the positive electrode 291 and the negative electrode 292 with respect to the first terminal 211 and the second terminal 212.

Figure 3:
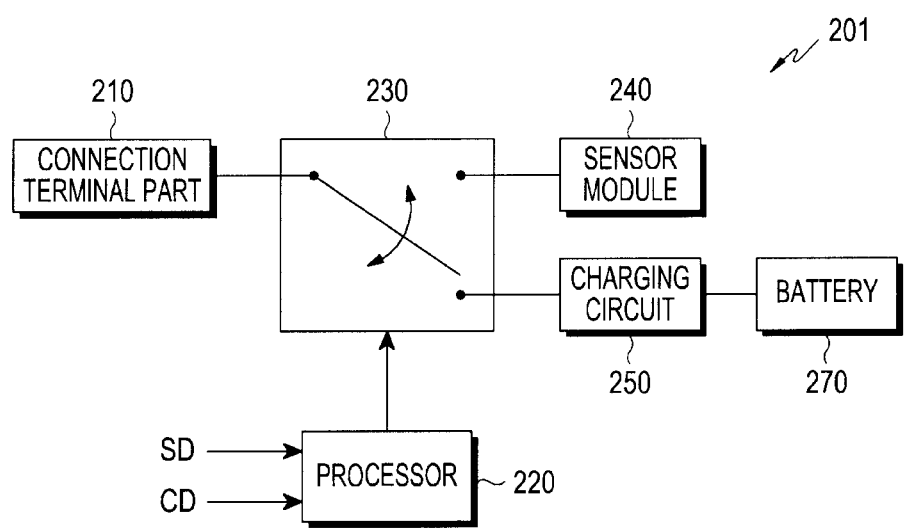
FIG. 3 is a block diagram schematically illustrating an electronic device according to an embodiment.

FIG. 3 is a block diagram schematically illustrating an electronic device according to an embodiment.

Referring to FIG. 3, the electronic device 201 may include the connection terminal part 210, a processor 220 (e.g. the processor 120 in FIG. 1), a switch circuit 230, a sensor module 240, a charging circuit 250, and a battery 270.

The connection terminal part 210 may connect to the charger 290 or to the user body 295.

The connection terminal part 210 may include the first terminal 211 and the second terminal 212. The first terminal 211 and the second terminal 212 may be connected to the sensor module 240 or the charging circuit 250 via the switch circuit 230.

The processor 220 may control overall operations of the electronic device 201.

According to an embodiment, the processor 220 may control the switch circuit 230. For example, the processor 220 may control the switch circuit 230 to connect the first terminal 211 and the second terminal 212 to the sensor module 240 or the charging circuit 250.

According to an embodiment, when a command (Sensing Demand (SD)) requesting acquisition of bio-information is input, the processor 220 may control the switch circuit 230 so as to allow the first terminal 211 and the second terminal 212 to be connected to the sensor module 240. The SD may be the result of a user input for obtaining bio-information or may be generated by an application for obtaining bio-information.

According to an embodiment, when a command (Charging Demand (CD)) requesting charging of the electronic device 201 is input, the processor 220 may control the switch circuit 230 so as to allow the first terminal 211 and the second terminal 212 to be connected to the charging circuit 250. The CD may result from the state where the electrodes 291 and 292 of the charger are connected to the first terminal 211 and the second terminal 212, and a voltage is applied to the first terminal 211 and the second terminal 212.

The switch circuit 230 may connect the connection terminal part 210 with the sensor module 240 or the charging circuit 250. The switch circuit 230 may be disposed between the connection terminal part 210 and the sensor module 240 or the charging circuit 250.

When acquisition of bio-information is requested, the switch circuit 230 may be connected to the sensor module 240. When charging of the electronic device 201 is requested, the switch circuit 230 may be connected to the charging circuit 250.

The sensor module 240 may measure or obtain bio-information of the user. For example, the sensor module 240 may include various sensor modules configured to obtain bio-information of the user, such as sensor modules configured to measure a user's Body Impedance Analysis (BIA), Photoplethysmogram (PPG), Electrocardiography (ECG), and Galvanic Skin Response (GSR). In addition, each of the sensor modules may be connected to the first terminal 211 and the second terminal 212 through the switch circuit 230.

The charging circuit 250 may include a circuit configured to charge the battery 270. The charging circuit 250 may be connected to the battery 270. The battery 270 may store electric power. Also, the battery 270 may supply stored power to the electronic device 201. For example, the charging circuit 250 and the battery 270 may be connected to the first terminal 211 and the second terminal 212 through the switch circuit 230.

Figure 4:
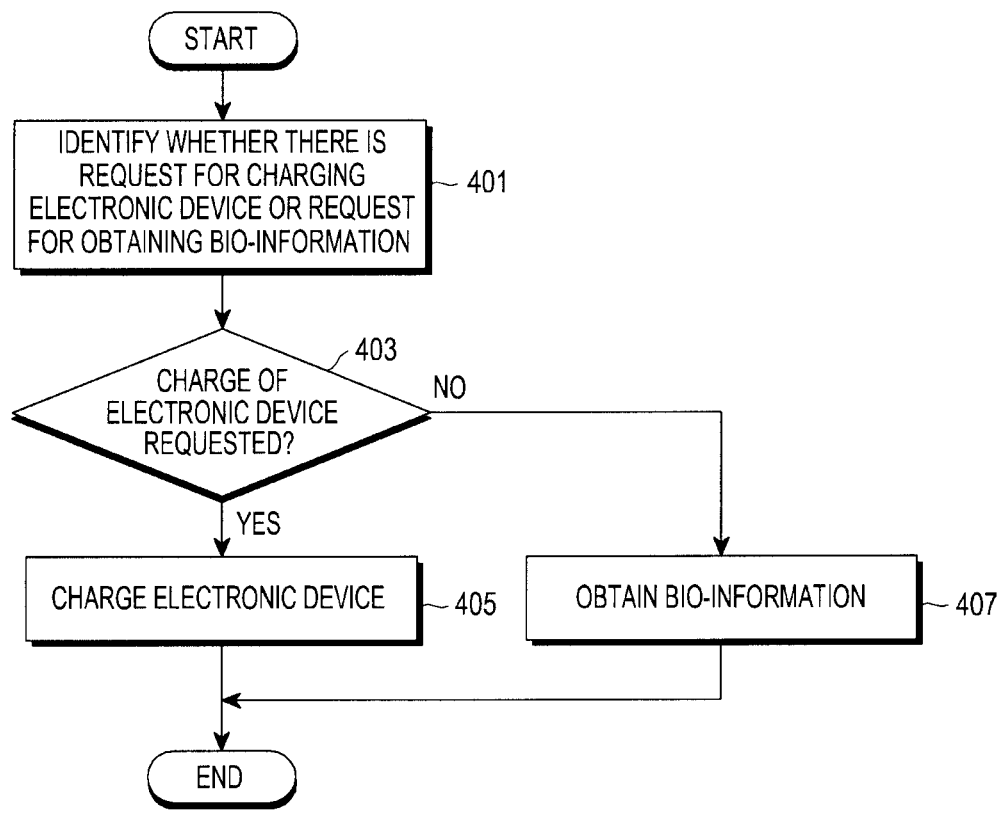
FIG. 4 is a flowchart for an operation of an electronic device according to an embodiment.

FIG. 4 is a flowchart for an operation of an electronic device according to an embodiment.

Referring to FIG. 4, the electronic device 201 may identify whether there is a request for charging the electronic device 201 or a request to use the electronic device 201 to obtain bio-information (operation 401).

When there is a request for charging the electronic device 201 (the case of "YES" in operation 403), the electronic device 201 may perform charging (operation 405). For example, the processor 220 may control the switch circuit 230 so as to allow the first terminal 211 and the second terminal 212 to be connected to the charging circuit 250 (or the battery 270 through the charging circuit 250). The electronic device 201 may charge the battery 270 with power obtained through the first terminal 211 and the second terminal 212.

When there is no request for charging the electronic device 201 (the case of "NO" in operation 403), the electronic device 201 may obtain bio-information (operation 407). For example, the processor 220 may control the switch circuit 230 so as to allow the first terminal 211 and the second terminal 212 to be connected with the sensor module 240. The electronic device 201 may obtain bio-information through the first terminal 211 and the second terminal 212.

Figure 5A:
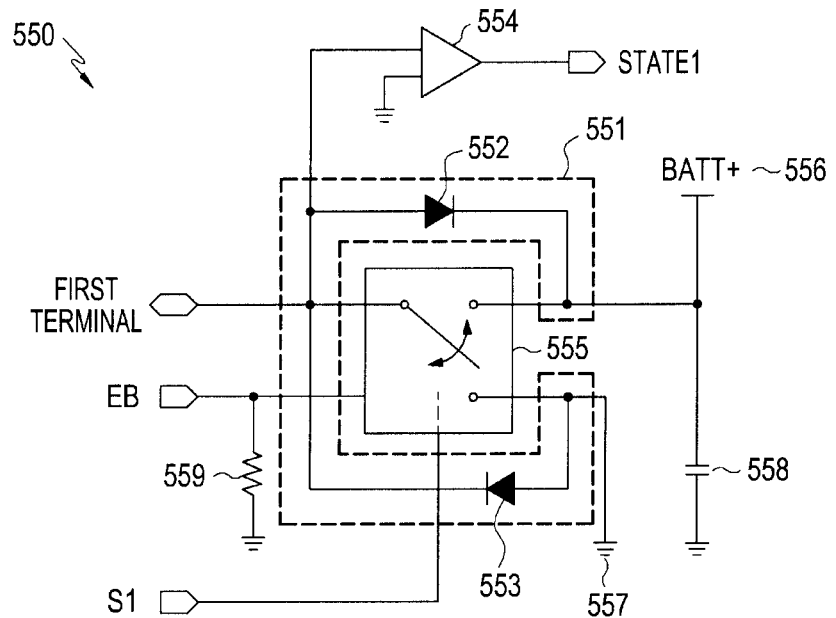
FIG. 5A and FIG. 5B are circuit diagrams schematically illustrating a charging device according to an embodiment.
Figure 5B:
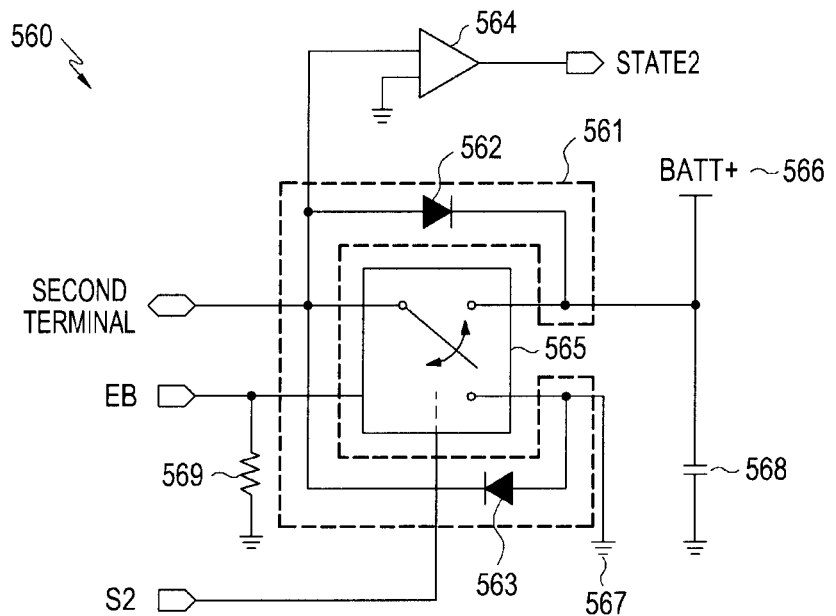

FIGS. 5A and 5B are circuit diagrams schematically illustrating a charging device according to an embodiment.

Referring to FIGS. 5A and 5B, a charging circuit 250 may include a first charging circuit 550 and a second charging circuit 560. For example, the first charging circuit 550 may be a charging circuit corresponding to a first terminal (e.g. the first terminal 211 in FIG. 2), and the second charging circuit 560 may be a charging circuit corresponding to a second terminal (e.g. the second terminal 212 in FIG. 2). That is, the first terminal 211 may be connected to a battery (e.g. the battery 270 in FIG. 3) through the first charging circuit 550, and the second terminal 212 may be connected to the battery 270 through the second charging circuit 560.

According to an embodiment, a bridge circuit may include a first diode 552, a second diode 553, a third diode 562, and a fourth diode 563. For example, the first diode 552 and the second diode 553 may have opposite directionalities. Also, the third diode 562 and the fourth diode 563 may have opposite directionalities. Meanwhile, the first diode 552 and the third diode 562 may have the same directionality.

For convenience of explanation, FIGS. 5A and 5B illustrate the first charging circuit 550 and the second charging circuit 560 respectively including a first bridge circuit 551 and a second bridge circuit 561 each including two diodes. However, the first bridge circuit 551 and the second bridge circuit 561 may be implemented as a single bridge circuit. That is, the first bridge circuit 551 may be a first part (e.g. the part corresponding to the first terminal 211) of the single bridge circuit, and the second bridge circuit 561 may be a second part (e.g. the part corresponding to the second terminal 212) of the single bridge circuit. In addition, a positive electrode terminal 556 and a negative electrode terminal 557 of the battery in FIG. 5A may be implemented identical, respectively, to a positive electrode terminal 566 and a negative electrode terminal 567 in FIG. 5B. Meanwhile, the negative electrode terminal 557 and/or 567 of the battery may be connected to a ground.

Referring to FIG. 5A, the first charging circuit 550 may include the first bridge circuit 551, a first voltage sensing circuit 554, a first switch 555, the positive electrode terminal 556 of the battery, the negative electrode terminal 557 of the battery, a first capacitor 558, and a first resistor 559.

The first bridge circuit 551 may connect the first terminal 211 with the positive electrode terminal 556 or the negative electrode terminal 557 of the battery. For example, based on the polarity of the voltage applied to the first terminal 211, the first bridge circuit 551 may electrically connect the first terminal 211 with the appropriate terminal among the positive electrode terminal 556 and the negative electrode terminal 557 of the battery. For example, the first bridge circuit 551 may be implemented as a full-bridge circuit.

The first diode 552 may be disposed between the first terminal 211 and the positive electrode terminal 556 of the battery.

The second diode 553 may be disposed between the first terminal 211 and the negative electrode terminal 557 of the battery. In one embodiment, the second diode 553 may have a directionality opposite to that of the first diode 552. For example, when the first diode 552 is a forward-biased diode, the second diode 553 may be implemented by a reverse-biased diode.

The first voltage sensing circuit 554 may output a first state signal STATE1 corresponding to the polarity of the voltage applied to the first terminal 211. In one embodiment, the first voltage sensing circuit 554 may include a comparator. The first state signal STATE1 may be a signal indicating the polarity of a voltage applied to the first terminal 211.

The first switch 555 may connect the first terminal 211 with the positive electrode terminal 556 or the negative electrode terminal 557 of the battery according to the control of the processor 220. For example, the first switch 555 may selectively connect the first terminal 211 with the positive electrode terminal 556 or the negative electrode terminal 557 of the battery, in response to signals EB and S1 output from the processor 220.

The positive electrode terminal 556 of the battery corresponds to the positive electrode of the battery 270. The negative electrode terminal 557 of the battery corresponds to the negative electrode of the battery 270.

The first capacitor 558 may be a de-coupling capacitor.
The first resistor 559 may be a pull-down resistor.

Referring to FIG. 5B, the second charging circuit 560 may include the second bridge circuit 561, a second voltage sensing circuit 564, a second switch 565, the positive electrode terminal 566 of the battery, the negative electrode terminal 567 of the battery, a second capacitor 568, and a second resistor 569.

The second charging circuit 560 may be similar to the first charging circuit 550.

The second bridge circuit 561 may connect the second terminal 212 with the positive electrode terminal 556 or the negative electrode terminal 557 of the battery. For example, based on the polarity of a voltage applied to the second terminal 212, the second bridge circuit 561 may electrically connect the second terminal 212 with the appropriate terminal among the positive electrode terminal 566 and the negative electrode terminal 567 of the battery. For example, the second bridge circuit 561 may be implemented as a full-bridge circuit.

The third diode 562 may be disposed between the second terminal 212 and the positive electrode terminal 566 of the battery.

The fourth diode 563 may be disposed between the second terminal 212 and the negative electrode terminal 567 of the battery. In one embodiment, the fourth diode 563 and the third diode 562 may have opposite directionalities. For example, when the third diode 562 is a forward-biased diode, the fourth diode 563 may be implemented by a reverse-biased diode.

The second voltage sensing circuit 564 may output a second state signal STATE2 corresponding to the polarity of the voltage applied to the second terminal 212. For example, the second voltage sensing circuit 564 may include a comparator. A second state signal STATE2 may be a signal indicating the polarity of a voltage applied to the second terminal 212.

The second switch 565 may connect the second terminal 212 with the positive electrode terminal 566 or the negative electrode terminal 567 of the battery according to the control of the processor 220. For example, the second switch 565 may selectively connect the second terminal 212 with the positive electrode terminal 566 or the negative electrode terminal 567 of the battery, in response to signals EB and S2 output from the processor 220.

The second capacitor 568 may be a de-coupling capacitor.
The second resistor 569 may be a pull-down resistor.

Figure 6:
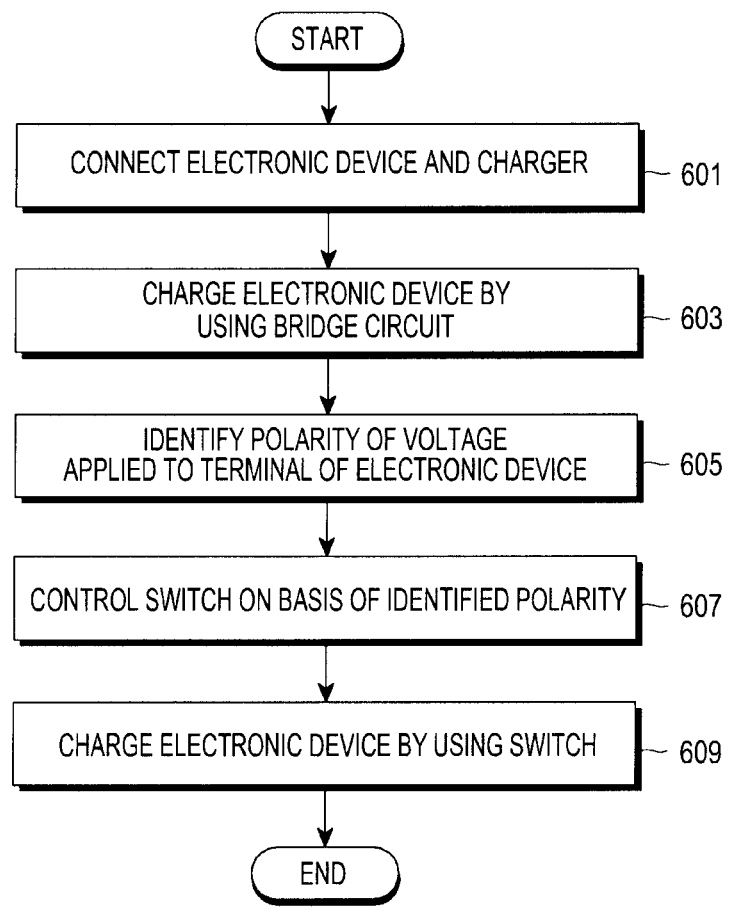
FIG. 6 is a flowchart for an operation of a charging device according to an embodiment.

FIG. 6 is a flowchart for an operation of a charging device according to an embodiment.

Referring to FIG. 6, an electronic device (the electronic device 201 in FIG. 2) may be connected to the charger 290 for charging (operation 601). In this case, the electronic device 201 may connect each of the terminals 211 and 212 included in the connection terminal part 210 with a bridge circuit (e.g. the circuits 551 and 561 in FIGS. 5A and 5B) included in the charging circuit 250.

The electronic device 201 may charge the electronic device 201 by using the bridge circuits 551 and 561 (operation 603). For example, the electronic device 201 may receive power supplied through the first terminal 211 and the second terminal 212. The electronic device 201 may connect the first terminal 211 with the positive electrode terminal 556 of the battery through the first bridge circuit 551, and may connect the second terminal 212 with the negative electrode terminal 567 of the battery through the second bridge circuit 561. The electronic device 201 may supply power supplied to the first terminal 211 and the second terminal 212 to the battery 270 by using the bridge circuits 551 and 561.

The electronic device 201 may identify (or determine) the polarity of the voltage applied to the connection terminal part 210 (operation 605). For example, the electronic device

201 may identify (or determine) the polarity by using a voltage sensing circuit (e.g. the voltage sensing circuits 554 and 564 in FIGS. 5A and 5B).

The electronic device 201 may switch the connections between the terminals 211 and 212 and the terminals 556 or 557 of the battery based on the determined polarity (operation 607). For example, based on the determined polarity, the electronic device 201 may connect the first terminal 211 with the negative electrode terminal 557 of the battery, and connect the second terminal 212 with the positive electrode terminal 566 of the battery.

The electronic device 201 may then charge the electronic device 201 by using the switch (e.g. the switches 555 and 565 in FIGS. 5A and 5B) (operation 609). For example, the electronic device 201 may control the switch to connect the terminals 211 and 212 to the terminals 756 and 757 of the battery, respectively. The polarity of the terminal of the battery will match the polarity of the terminal 211 or 212. Power supplied to the connection terminal part 210 may then be transmitted to the battery 270.

Figure 7A:
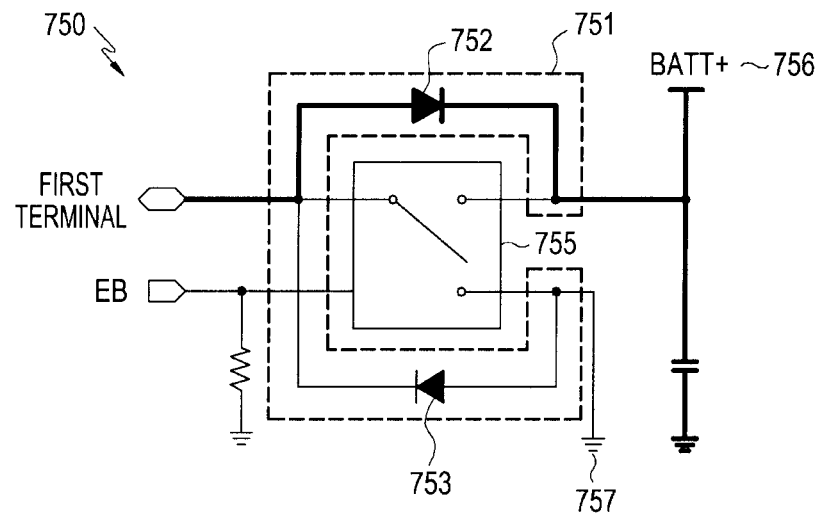
FIG. 7A and FIG. 7B are circuit diagrams for explaining an operation of a bridge circuit according to an embodiment.
Figure 7B:
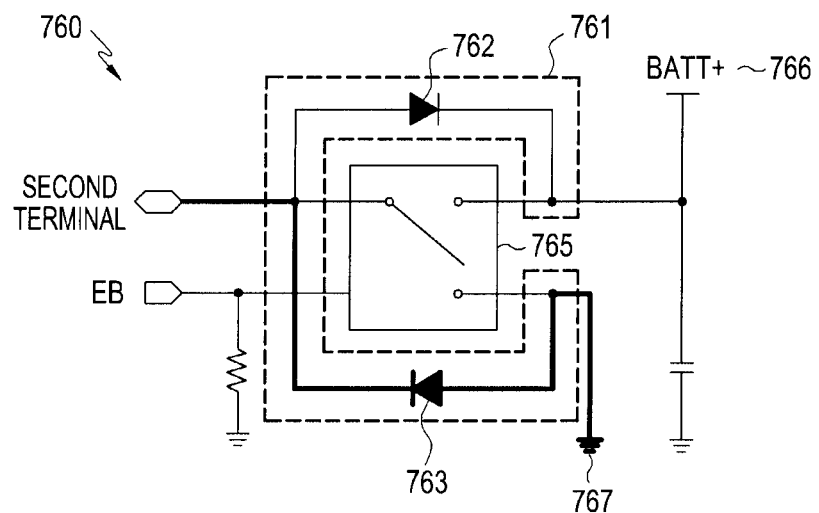

FIGS. 7A and 7B are circuit diagrams for explaining an operation of a bridge circuit according to an embodiment.

Referring to FIGS. 7A and 7B, a first charging circuit 750 and a second charging circuit 760 may be implemented as being substantially identical to the first charging circuit 550 and the second charging circuit 560 which have been described with reference to FIGS. 5A and 5B. Hereinafter, the operations of the first bridge circuit 551 included in the first charging circuit 550 and the second bridge circuit 561 included in the second charging circuit 560 will be described with reference to FIGS. 7A and 7B.

Referring to FIG. 7A, the first charging circuit 750 may include a first bridge circuit 751, a first switch 755, a positive electrode terminal 756 of the battery, and a negative electrode terminal 757 of the battery.

The positive electrode terminal 756 of the battery and the negative electrode terminal 757 of the battery may be implemented as being substantially identical to the positive electrode terminal 556 of the battery and the negative electrode terminal 557 of the battery in FIG. 5A.

The first bridge circuit 751 may include a first diode 752 and a second diode 753.

According to an embodiment, when a voltage applied to the first terminal (e.g. the first terminal 211 in FIG. 2) is a positive voltage, the voltage applied to the first terminal 211 may be applied to the positive electrode terminal 756 of the battery through the first diode 752, due to the characteristics of the diode. The voltage applied to the positive electrode terminal 756 of the battery may be smaller than the voltage applied to the first terminal 211, due to the voltage drop on the first diode 752. For example, when the voltage applied to the first terminal 211 is 5 V, the voltage applied to the positive electrode terminal 756 of the battery through the first diode 752 may be 4 V. In this case, when the battery 270 is a lithium ion battery, using the bridge circuit, the electronic device 201 may not be able to be charged up to 4.2 V, which is the full charge voltage of the lithium ion battery.

According to an embodiment, when the voltage applied to the first terminal 211 is a positive voltage, the voltage cannot be applied to a terminal of the battery 270 through the second diode 753, due to the characteristics of the diode.

Therefore, when a positive voltage is applied to the first terminal 211, the first terminal 211 may be connected to the positive electrode terminal 756 of the battery, due to the characteristics of the diode, and regardless of the control of the processor 220.

Similarly, according to another embodiment, when a negative voltage is applied to the first terminal 211, the first terminal 211 may be connected to the negative electrode terminal 757 of the battery, due to the characteristics of the diodes, and regardless of the control of the processor 220.

The first switch 755 may be opened in response to the control of the processor 220. For example, the first switch 755 may be opened on the basis of a signal EB output from the processor 220.

Referring to FIG. 7B, the second charging circuit 760 may include a second bridge circuit 761, a second switch 765, a positive electrode terminal 766 of the battery 270, and a negative electrode terminal 767 of the battery.

The positive electrode terminal 766 of the battery and the negative electrode terminal 767 of the battery may be implemented as being substantially identical to the positive electrode terminal 566 of the battery and the negative electrode terminal 567 of the battery in FIG. 5B.

The second bridge circuit 761 may include a third diode 762 and a fourth diode 763.

According to an embodiment, when a voltage applied to the second terminal (e.g. the second terminal 212 in FIG. 2) is a negative voltage, the voltage applied to the second terminal 212 may be applied to the negative electrode terminal 767 of the battery 270 through the fourth diode 763, due to the characteristics of the diode.

According to an embodiment, when the voltage applied to the second terminal 212 is a negative voltage, the voltage cannot be applied to the terminal of the battery 270 through the third diode 762, according to the characteristic of the diode.

Therefore, when a negative voltage is applied to the second terminal 212, the second terminal 212 may be connected to the negative electrode terminal 767 of the battery 270, due to the characteristics of the diodes, and regardless of the control of the processor 220.

According to another embodiment, when a positive voltage is applied to the second terminal 212, the second terminal 212 may be connected to the positive electrode terminal 766 of the battery 270, due to the characteristics of the diodes, and regardless of the control of the processor 220.

The second switch 765 may be opened in response to the control of the processor 220. For example, the second switch 765 may be opened on the basis of a signal EB output from the processor 220.

According to an embodiment, when the first terminal 211 is connected to the positive electrode terminal 756 of the battery 270 through the first bridge circuit 751, the second terminal 212 may be connected to the negative electrode terminal 767 of the battery 270 through the second bridge circuit 761. In addition, when the first terminal 211 is connected to the negative electrode terminal 757 of the battery through the first bridge circuit 751, the second terminal 212 may be connected to the positive electrode terminal 766 of the battery through the second bridge circuit 761.

Figure 8:
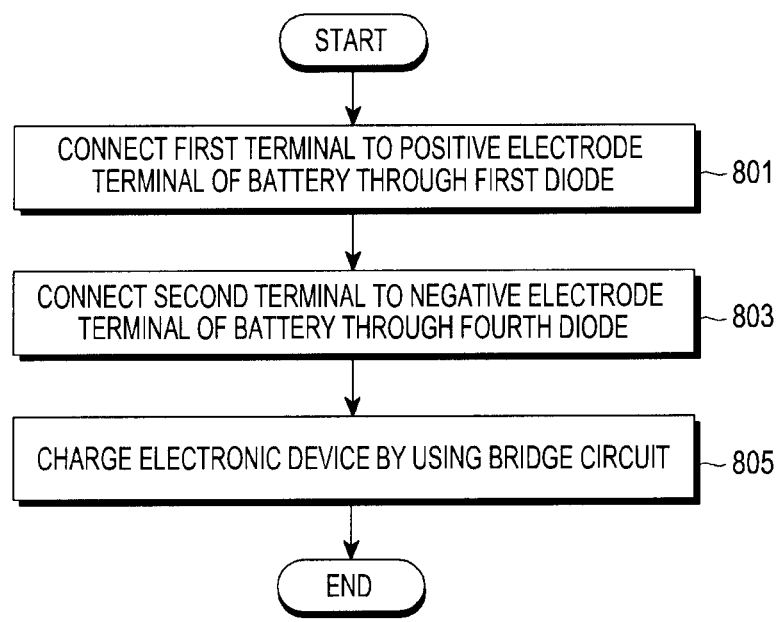
FIG. 8 is a flowchart for a charging operation using a bridge circuit according to an embodiment.

FIG. 8 is a flowchart for a charging operation using a bridge circuit according to an embodiment.

Referring to FIG. 8, a first terminal (e.g. the first terminal 211 in FIG. 2) may be connected to the positive electrode terminal 756 of the battery 270 through the first diode 752 of the first bridge circuit 751 (operation 801).

A second terminal (e.g. the second terminal 212 in FIG. 2) may be connected to the negative electrode terminal 767 of the battery 270 through the fourth diode 763 of the second bridge circuit 761 (operation 803).

In addition, when the first terminal 211 is connected to the negative electrode terminal 757 of the battery through the second diode 753 included in the first bridge circuit 751, the second terminal 212 may be connected to the positive electrode terminal 766 of the battery through the third diode 762 included in the second bridge circuit 761.

The electronic device 201 may charge the battery 270, where the charging is based on the characteristics of the diodes included in the bridge circuit (operation 805). In this way, using the bridge circuits 751 and 761, the electronic device 201 may charge the battery 270 regardless of the voltage polarity applied to the first terminal 211 and the second terminal 212.

Figure 9A:
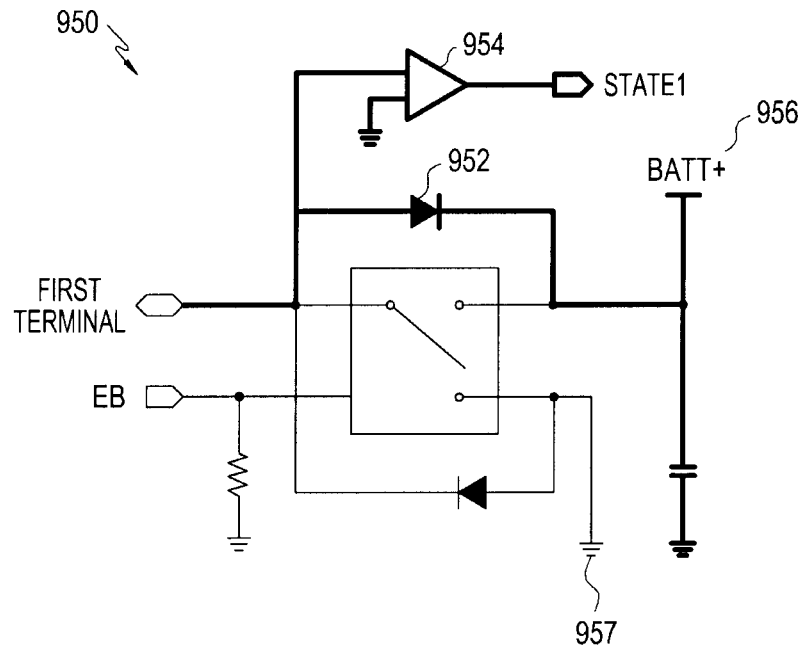
FIG. 9A and FIG. 9B are circuit diagrams for explaining an operation of a voltage sensing circuit according to an embodiment.
Figure 9B:
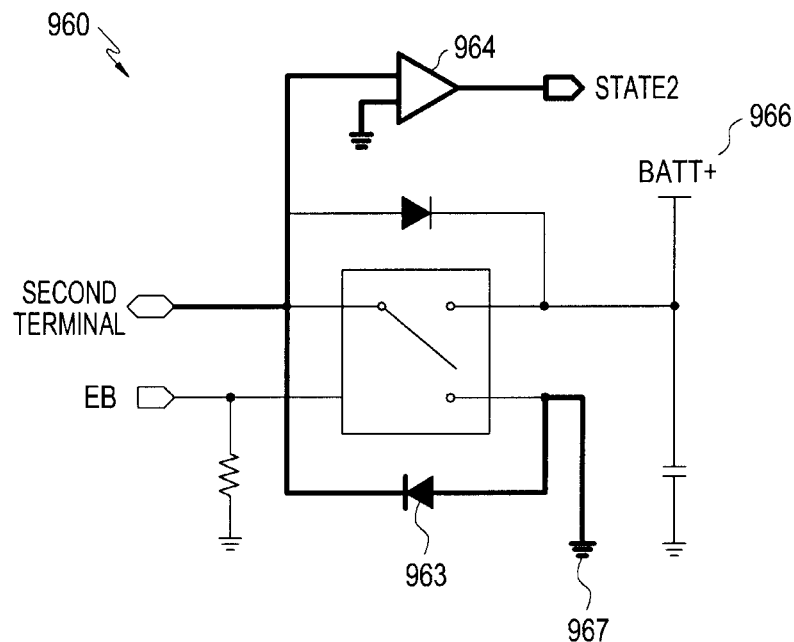

FIGS. 9A and 9B are circuit diagrams for explaining an operation of a voltage sensing circuit according to an embodiment.

Referring to FIGS. 9A and 9B, a first charging circuit 950 and a second charging circuit 960 may be implemented as being substantially identical to the first charging circuit 550 and the second charging circuit 560 which have been described with reference to FIGS. 5A and 5B. Hereinafter, the operations of the first voltage sensing circuit 554 included in the first charging circuit 550 and the second voltage sensing circuit 564 included in the second charging circuit 560 will be described with reference to FIGS. 9A and 9B.

Referring to FIG. 9A, the first charging circuit 950 may include a first diode 952, a first voltage sensing circuit 954, a positive electrode terminal 956 of the battery, and a negative electrode terminal 957 of the battery.

The positive electrode terminal 956 of the battery and the negative electrode terminal 957 of the battery may be implemented as being substantially identical to the positive electrode terminal 556 of the battery and the negative electrode terminal 557 of the battery in FIG. 5A.

A processor (e.g. the processor 220 in FIG. 3) may identify the voltage of power stored in the battery 270. For example, when the voltage of power stored in the battery 270 is equal to or greater than a designated value, the processor 220 may identify (or determine) the polarity of the voltage applied to the first terminal 211. Accordingly, the designated value may be a voltage value indicating that the electronic device 201 can operate on battery power alone.

According to an embodiment, when the voltage of power stored in the battery 270 is equal to or greater than the designated voltage value, the processor 220 may output a battery usable signal (Enable Battery (EB)). For example, the EB signal may indicate that even when external power supply is stopped, the electronic device 201 can operate on battery power alone. In this example, when the EB signal has the value "1," the voltage of the battery 270 may be equal to or greater than the designated voltage value. But if the EB signal is not output or has the value "0," the voltage of the battery 270 may be smaller than the designated voltage value.

According to an embodiment, when the voltage of power stored in the battery 270 is equal to or greater than the designated voltage value, the processor 220 may identify the polarity of the voltage applied to the first terminal 211 by using the first voltage sensing circuit 954.

The first terminal 211 may be connected to the positive electrode terminal 956 of the battery through the first diode 952. Then, the voltage applied to the first terminal 211 may be also applied to the first voltage sensing circuit 954.

The first voltage sensing circuit 954 may output a first state signal STATE1 indicating the polarity of the voltage applied to the first terminal 211. For example, when the voltage applied to the first terminal 211 is a positive voltage, the first state signal STATE1 may have the value "1" or "high". On the contrary, when the voltage applied to the first terminal 211 is a negative voltage, the first state signal STATE1 may have the value "0" or "low". For example, the first voltage sensing circuit 954 may be implemented to include a comparator.

Referring to FIG. 9B, the second charging circuit 960 may include a fourth diode 963, a second voltage sensing circuit 964, a positive electrode terminal 966 of the battery, and a negative electrode terminal 967 of the battery.

The positive electrode terminal 966 of the battery and the negative electrode terminal 967 of the battery may be implemented as being substantially identical to the positive electrode terminal 556 of the battery and the negative electrode terminal 557 of the battery in FIG. 5A.

According to an embodiment, when the voltage of power stored in the battery 270 is equal to or greater than the designated value, the processor 220 may identify the polarity of the voltage applied to the second terminal 212 by using the second voltage sensing circuit 964.

The second terminal 212 may be connected to the negative electrode terminal 967 of the battery through the fourth diode 963. Then, the voltage applied to the second terminal 212 may be also applied to the second voltage sensing circuit 964.

The second voltage sensing circuit 964 may output a second state signal STATE2 indicating the polarity of the voltage applied to the second terminal 212. For example, when the voltage applied to the second terminal 212 is a negative voltage, the second state signal STATE2 may have the value "0" or "low". On the contrary, when the voltage applied to the second terminal 212 is a positive voltage, the second state signal STATE2 may have the value "1" or "high". For example, the second voltage sensing circuit 964 may be implemented to include a comparator.

Figure 10:
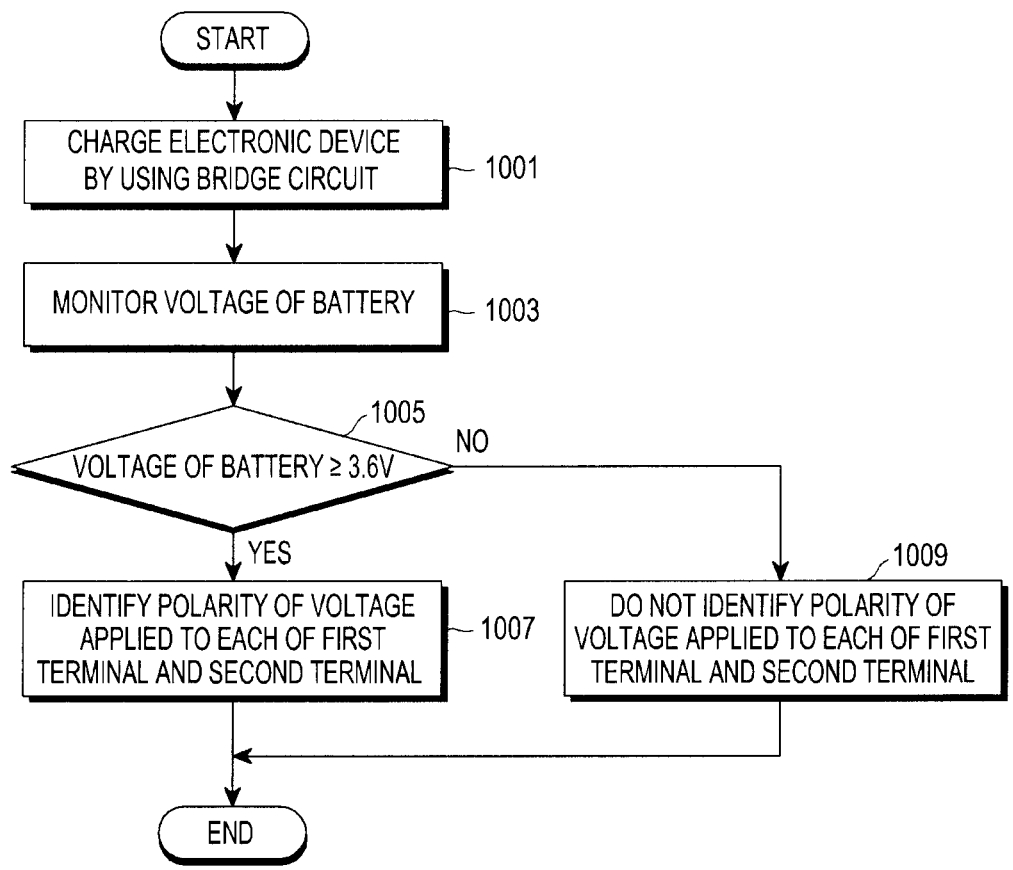
FIG. 10 is a flowchart for an operation of a voltage sensing circuit according to an embodiment.

FIG. 10 is a flowchart for an operation of a voltage sensing circuit according to an embodiment.

Referring to FIG. 10, the electronic device 201 may be charged by using a bridge circuit (operation 1001).

A processor (e.g. the processor 220 in FIG. 3) may monitor the voltage of power stored in the battery 270 (operation 1003). For example, the processor 220 may monitor the voltage of power stored in a battery (e.g. the battery 270 in FIG. 3) for to a designated time period or in real time.

The processor 220 may compare the voltage of the battery with a designated voltage value (operation 1005).

When the voltage of the battery is equal to or greater than the designated voltage value (e.g. 3.6 V) (the case of "YES" in operation 1005), the processor 220 may identify the polarity of the voltage applied to each of the first terminal 211 and the second terminal 212 (operation 1007). For example, the processor 220 may identify the polarity of the first terminal 211 using the first state signal STATE1 output from the first voltage sensing circuit 954. In one embodiment, when the first state signal STATE1 has the value "1" or "high," the processor 220 may determine that the voltage applied to the first terminal 211 is positive. In addition, the processor 220 may identify the polarity of the second terminal 212 using the second state signal STATE2 output from the second voltage sensing circuit 964. In one embodiment, when the second state signal STATE2 has the value "0" or "low," the processor 220 may determine the voltage applied to the second terminal 212 is negative.

On the contrary, when the voltage of the battery 270 is smaller than the designated value (the case of "NO" in operation 1005), the processor 220 may not identify the polarity of the voltage applied to each of the first terminal 211 and the second terminal 212 (operation 1009). For example, when the voltage of the battery 270 is smaller than the designated value, the processor 220 may ignore the first state signal STATE1 output from the first voltage sensing circuit. Thus, when the voltage of the battery 270 is smaller than the designated value, the processor 220 may not identify the polarity of the voltage applied to each of the first terminal 211 and the second terminal 212.

Figure 11A:
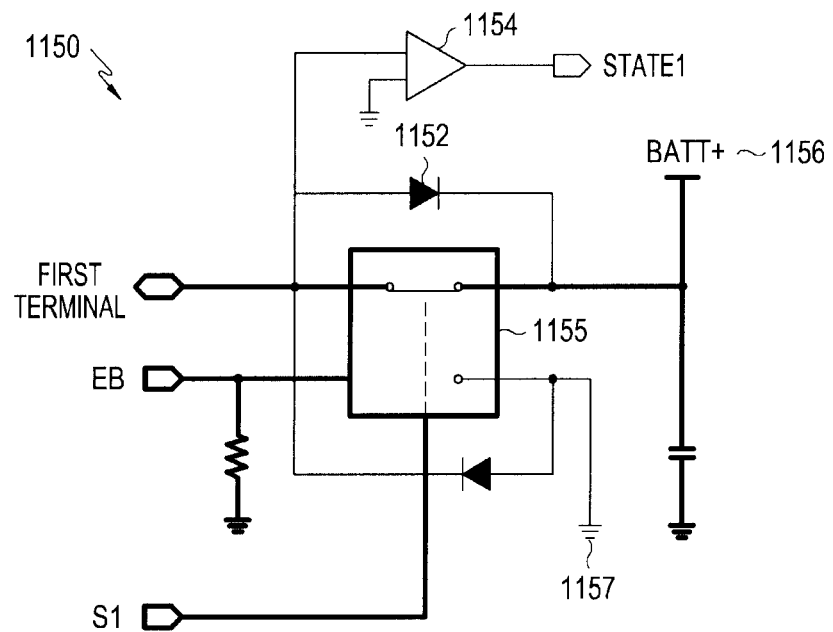
FIG. 11A and FIG. 11B are circuit diagrams for explaining an operation of a switch according to an embodiment.
Figure 11B:
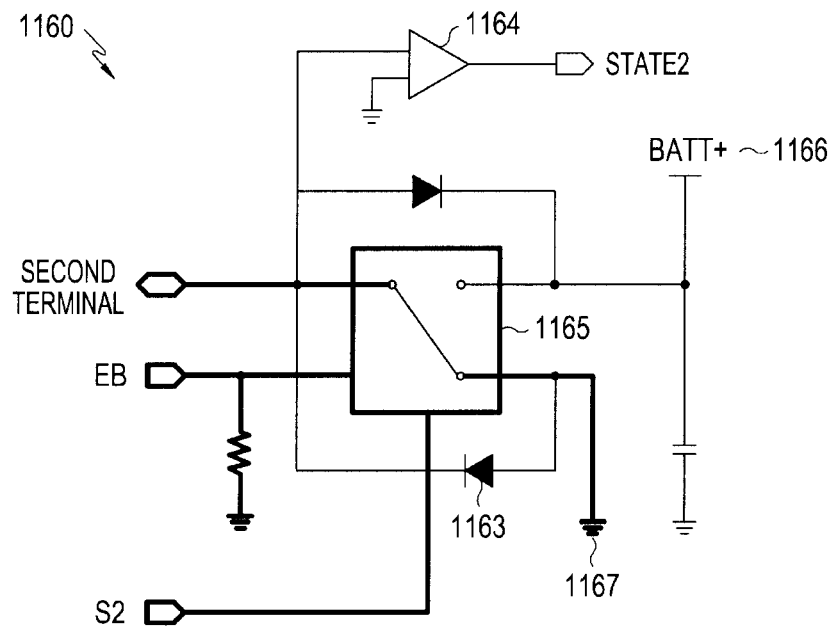

FIGS. 11A and 11B are circuit diagrams for explaining an operation of a switch according to an embodiment.

Referring to FIGS. 11A and 11B, a first charging circuit 1150 and a second charging circuit 1160 may be implemented as being substantially identical to the first charging circuit 550 and the second charging circuit 560 which have been described with reference to FIGS. 5A and 5B. Hereinafter, the operations of the first switch 555 included in the first charging circuit 550 and the second switch 565 included in the second charging circuit 560 will be described with reference to FIGS. 11A and 11B.

Referring to FIG. 11A, the first charging circuit 1150 may include a first diode 1152, a first voltage sensing circuit 1154, a first switch 1155, a positive electrode terminal 1156 of the battery, and a negative electrode terminal 1157 of the battery.

A processor (e.g. the processor 220 in FIG. 3) may identify the polarity of the voltage applied to the first terminal 211 using first state signal STATE1. The processor 220 may control the first switch 1155 so as to allow the first terminal 211 to be connected to a terminal of the battery 270 whose polarity matches the polarity of the voltage applied to the first terminal 211. For example, the processor 220 may transmit a first switch control signal S1 to the first switch 1155 so as to allow the first terminal 211 to be connected to the positive electrode terminal 1156 of the battery or the negative electrode terminal 1157 of the battery. In one embodiment, the first switch control signal S1 may be a signal for controlling the first switch 1155.

For example, the processor 220 may determine whether the voltage of power stored in the battery 270 is equal to or greater than a designated voltage value (e.g. 3.6 V). When the voltage of the battery 270 is equal to or greater than the designated voltage value (in one embodiment, when the battery usable signal EB indicates the value "1"), the processor 220 may identify the polarity of the voltage applied to the first terminal 211 using the first state signal STATE1 output from the first voltage sensing circuit 1154. For example, when the first state signal STATE1 indicates the value "1" or "high," the processor 220 may identify that a positive voltage is applied to the first terminal 211. The processor 220 may transmit a first switch control signal S1 to the first switch 1155 to control the first switch 1155 so as to connect the first terminal 211, to which a positive voltage is applied, to the positive electrode terminal 1156 of the battery. The connection between the first terminal 211 and the positive electrode terminal 1156 of the battery through the first diode 1152 then may be released.

According to another embodiment, when the first state signal STATE1 indicates the value "0" or "low," the processor 220 may identify that a negative voltage is applied to the first terminal 211. The processor 220 may then transmit a first switch control signal S1 to the first switch 1155 to control the first switch 1155 so as to connect the first terminal 211, to which a negative voltage is applied, to the negative electrode terminal 1157 of the battery.

Referring to FIG. 11B, the second charging circuit 1160 may include a fourth diode 1163, a second voltage sensing circuit 1164, a second switch 1165, a positive electrode terminal 1166 of the battery, and a negative electrode terminal 1167 of the battery.

A processor (e.g. the processor 220 in FIG. 3) may identify the polarity of the voltage applied to the second terminal 212 using the second state signal STATE2. The processor 220 may control the second switch 1165 so as to allow the second terminal 212 to be connected to a terminal of the battery 270 whose polarity matches the polarity of the voltage applied to the second terminal 212. For example, the processor 220 may transmit a second switch control signal S2 to the second switch 1165 so as to allow the second terminal 212 to be connected to the positive electrode terminal 1166 of the battery or the negative electrode terminal 1167 of the battery. In one embodiment, a second switch control signal S2 may be a signal for controlling the second switch 1165.

For example, the processor 220 may determine whether the voltage of power stored in the battery 270 is equal to or greater than a designated voltage value (e.g. 3.6 V). When the voltage of the battery 270 is equal to or greater than the designated voltage value (in one embodiment, when the battery usable signal EB indicates the value "1"), the processor 220 may identify the polarity of the voltage applied to the second terminal 212 using the second state signal STATE2 output from the second voltage sensing circuit 1164. For example, when a second state signal STATE2 indicates the value "0" or "low," the processor 220 may identify that a negative voltage is applied to the second terminal 212. The processor 220 may transmit a second switch control signal S2 to the second switch 1165 to control the second switch 1165 so as to connect the second terminal 212, to which a negative voltage is applied, to the negative electrode terminal 1167 of the battery. The connection between the second terminal 212 and the negative electrode terminal 1167 of the battery through the fourth diode 1163 may then be released.

According to another embodiment, when the second state signal STATE2 indicates the value "1" or "high," the processor 220 may identify that a positive voltage is applied to the second terminal 212. The processor 220 may then transmit a second switch control signal S2 to the second switch 1165 to control the second switch 1165 so as to connect the second terminal 212, to which a positive voltage is applied, to the positive electrode terminal 1166 of the battery.

FIG. 12 is a table showing correlation between various signals for controlling a switch according to an embodiment.

Referring to FIG. 12, in response to a first state signal STATE1, a second state signal STATE2, and a battery usable signal EB, a processor (e.g. the processor 220 in FIG. 3) may output a first switch control signal S1 and a second switch control signal S2.

When there is no voltage applied to the first terminal 211 and the second terminal 212 (e.g. when state signals STATE1 and STATE2 each correspond to "0" or "low"), the processor 220 may determine that the battery 270 is not being charged. Then, the processor 220 may open the switches, such as the switches 1155 and 1165 of FIGS. 11A and 11B. For example, the processor 220 may output switch control signals S1 and S2 indicating the value "0" or "low". In another embodiment, the processor 220 may not separately control the switches 1155 and 1165.

Thus, the processor 220 may open the first switch 1155 and the second switch 1165. For example, the processor 220 may respectively output, to the first switch 1155 and the second switch 1165, the first switch control signal S1 and the second switch control signal S2, each of which indicates the value "0" or "low," in which case the first switch 1155 and the second switch 1165 are opened.

The processor 220 may monitor the voltage of power stored in the battery 270. For example, when the voltage of the battery 270 is smaller than the designated voltage value (e.g. when the battery usable signal EB indicates the value "0" or "low"), the processor 220 may not identify the polarity of the voltage applied to each of the first terminal 211 and the second terminal 212. In doing so, the processor 220 may ignore the state signals STATE1 or STATE2. For example, even in the case where a first state signal STATE1 indicating the value "1" is received, when the voltage of the battery 270 is smaller than the designated voltage value, the processor 220 may maintain the open state of the first switch 1155 (e.g. S1=0). In addition, even in the case where a second state signal STATE2 indicating the value "1" is received, when the voltage of the battery 270 is smaller than the designated voltage value, the processor 220 may maintain the open state of the second switch 1165 (e.g. S2=0).

When the voltage of the battery 270 is equal to or greater than the designated voltage value (e.g. when a battery usable signal EB is the value "1" or "high"), the processor 220 may identify the polarity of the voltage applied to each of the first terminal 211 and the second terminal 212. For example, when the battery usable signal EB has the value "1," the first state signal STATE1 has the value "1," and the second state signal STATE2 has the value "0," the processor 220 may control the first switch 1155 so as to connect the first terminal 211 to the positive electrode terminal 1256 of the battery, and may control the second switch 1165 so as to connect the second terminal 212 to the negative electrode terminal 1267 of the battery. In this example, the processor 220 may output a first switch control signal S1 indicating the value "1" to the first switch 1155, and may output a second switch control signal S2 indicating the value "0" to the second switch 1165. In response to the first switch control signal S1, the first switch 1155 may connect the first terminal 211 and the positive electrode terminal 1256 of the battery. Similarly, in response to the second switch control signal S2, the second switch 1165 may connect the second terminal 212 and the negative electrode terminal 1267 of the battery.

In addition, when the battery usable signal EB has the value "1," the first state signal STATE1 has the value "0," and the second state signal STATE2 has the value "1," the processor 220 may control the first switch 1155 so as to connect the first terminal 211 to the negative electrode terminal 1257 of the battery, and may control the second switch 1165 so as to connect the second terminal 212 to the positive electrode terminal 1266 of the battery. In this example, the processor 220 may output a first switch control signal S1 indicating the value "0" to the first switch 1155, and may output a second switch control signal S2 indicating the value "1" to the second switch 1165. In response to the first switch control signal S1, the first switch 1155 may connect the first terminal 211 and the negative electrode terminal 1257 of the battery. Similarly, in response to the second switch control signal S2, the second switch 1165 may connect the second terminal 212 and the positive electrode terminal 1266 of the battery.

Figure 13:
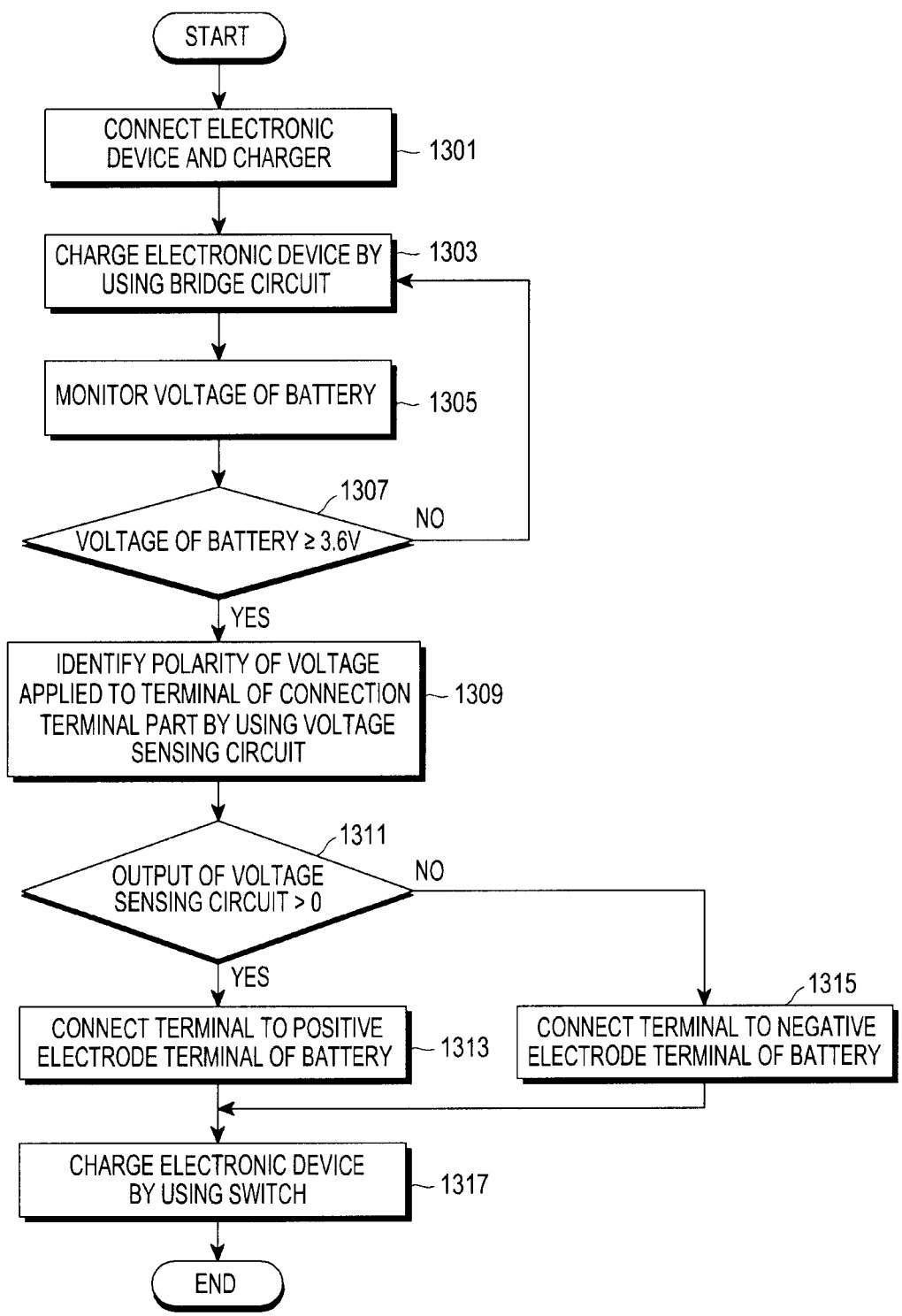
FIG. 13 is a flowchart for a charging operation using a switch according to an embodiment.

FIG. 13 is a flowchart for a charging operation using a switch according to an embodiment.

Referring to FIG. 13, an electronic device (e.g. the electronic device 201 in FIG. 2) may be connected to a charger (e.g. the charger 290 in FIG. 2) for charging (operation 1301). For example, the electronic device 201 may be connected to the charger 290 by connecting the first terminal 211 and the second terminal 212 with the positive electrode 291 and the negative electrode 292 of the charger 290, respectively.

The electronic device 201 may use a bridge circuit to charge the battery 270 (operation 1303). For example, the electronic device 201 may use a bridge circuit to charge the battery 270 regardless of whether the first terminal 211 or the second terminal 212 is connected to the positive electrode 291 of the charger 290. Likewise, the electronic device 201 may use the bridge circuit to charge the battery 270 regardless of whether the first terminal 211 or the second terminal 212 is connected to the negative electrode 292 of the charger 290. However, as explained above, due to the voltage drop across the diodes of the bridge circuit, the electronic device 201 may not be able to fully charge the battery 270 using the bridge circuit. Accordingly, the electronic device 201 may use a switch to fully charge the battery 270.

The electronic device 201 may monitor the voltage of the battery (operation 1305). For example, the electronic device 201 may monitor the voltage of power stored in the battery for to a designated time period or in real time.

The electronic device 201 may compare the voltage of the battery 270 with a designated voltage value (e.g. 3.6 V) (operation 1307). For example, the electronic device 201 may compare the voltage of the battery 270 with the designated voltage value (e.g. 3.6 V) to determine whether the power stored in the battery 270 is enough to operate the electronic device 201. For example, when the voltage of the battery 270 exceeds the designated voltage value, the electronic device 201 may charge the battery using a switch.

When the voltage of the battery is smaller than a designated voltage value (e.g. 3.6 V) (the case of "NO" in operation 1307), the electronic device 201 may continue to charge the battery 270 by using the bridge circuit.

According to an embodiment, when the voltage of the battery is equal to or greater than the designated voltage value (e.g. 3.6 V) (the case of "YES" in operation 1307), the electronic device 201 may identify the polarity of the voltage applied to the terminal 211 or 212 included in the connection terminal part 210 by using a voltage sensing circuit (operation 1309).

According to another embodiment, the electronic device 201 may identify the polarity of a voltage applied to each of the first terminal 211 and the second terminal 212 included in the connection terminal part 210 by using a voltage sensing circuit, regardless of the voltage of the battery.

The electronic device 201 may identify an output (e.g. state signal) of the voltage sensing circuit (operation 1311).

When the output (e.g. state signal) of the voltage sensing circuit is greater than the value "0" (the case of "YES" in operation 1311), the electronic device 201 may control a switch so as to connect the corresponding terminal to the positive electrode terminal of the battery (operation 1313).

When the output (e.g. state signal) of the voltage sensing circuit is not greater than the value "0" (the case of "NO" in operation 1311), the electronic device 201 may control a switch so as to connect the corresponding terminal to the negative electrode terminal of the battery (operation 1315).

Afterwards, the electronic device 201 may charge the battery 270 of the electronic device 201 by using the switch (operation 1317). In one embodiment, the electronic device 201 may charge the battery 270 by connecting the terminals of the connection terminal part 210 to the terminals of the battery 270, where the polarities of the terminals are matched. For example, the electronic device 201 may control a switch so as to connect a terminal, to which a positive voltage is applied, to the positive electrode terminal of the battery, and connect another terminal, to which a negative voltage is applied, to the negative electrode terminal of the battery.

FIGS. 14A to 14D are block diagrams of an electronic device and a charger according to an embodiment.

Referring to FIGS. 14A to 14D, an electronic device 1401 may be implemented as being substantially identical to or similar to the electronic device 201 described with reference to FIG. 2. Also, a charger 1490 may be implemented as being substantially identical to or similar to the charger 290 described with reference to FIG. 2

Figure 14A:
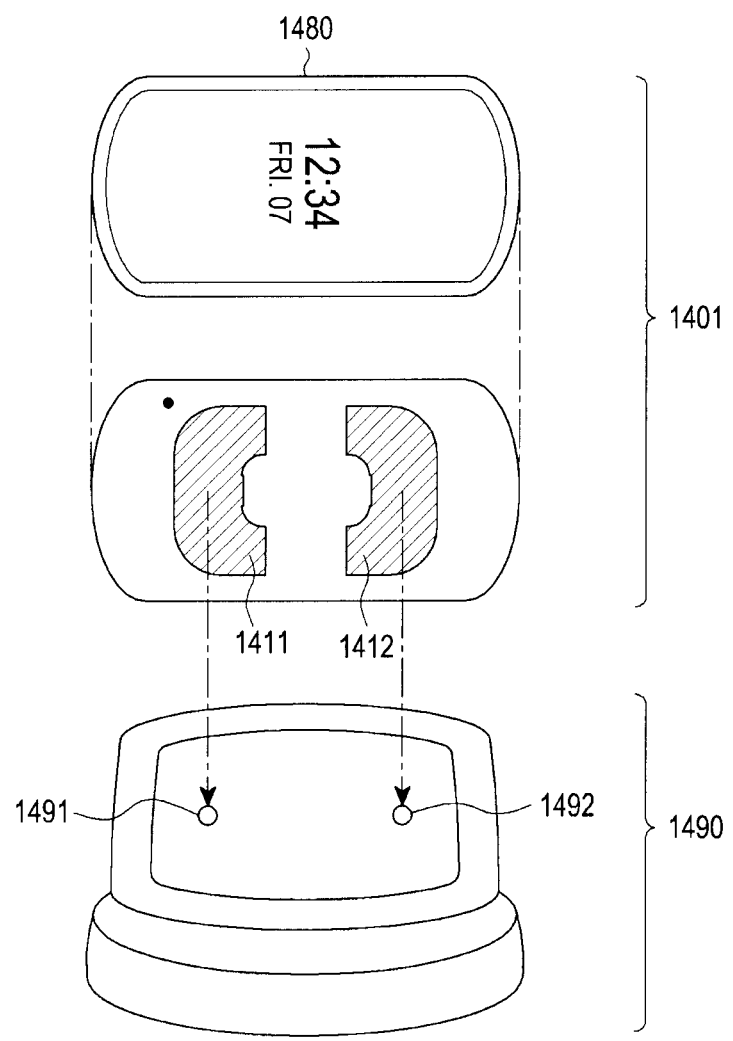
FIG. 14A, FIG. 14B, FIG. 14C and FIG. 14D are block diagrams of an electronic device and a charger according to an embodiment.

Referring to FIG. 14A, the electronic device 1401 may be put on the charger 1490 in a first direction. For example, the first direction may be a direction in which the first terminal 1411 is connected to the first electrode 1491 of the charger 1490, and the second terminal 1412 is connected to the second electrode 1492 of the charger.

When the electronic device 1401 is put on the charger 1490 in the first direction, the electronic device 1401 may charge its battery by using power supplied from the charger 1490.

Figure 14B:
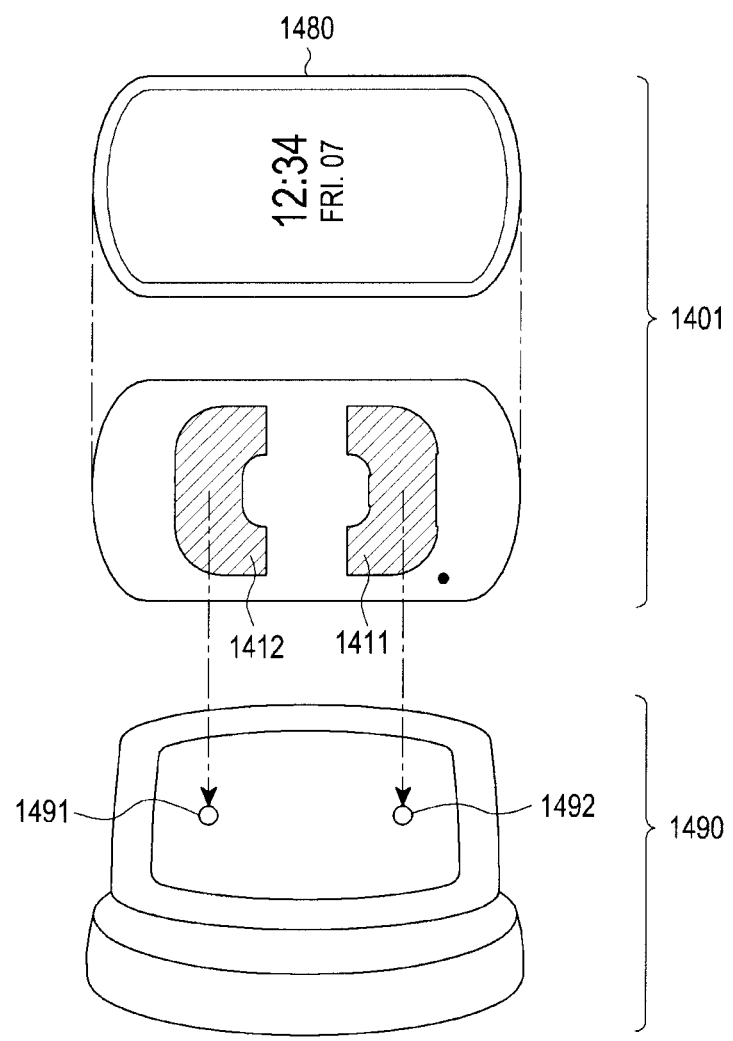

Referring to FIG. 14B, the electronic device 1401 may be put on the charger 1490 in a second direction. For example, the second direction may be a direction in which the second terminal 1412 is connected to the first electrode 1491 of the charger 1490, and the first terminal 1411 is connected to a second electrode 1492 of the charger. Thus, the second direction may be opposite to the first direction.

When the electronic device 1401 is put on the charger 1490 in the second direction, the electronic device 1401 may also charge its battery by using power supplied from the charger 1490.

Referring to FIGS. 14A and 14B, the electronic device 1401 may charge the battery using power from the charger 1490 regardless of its orientation with respect to the charger 1490.

Figure 14C:
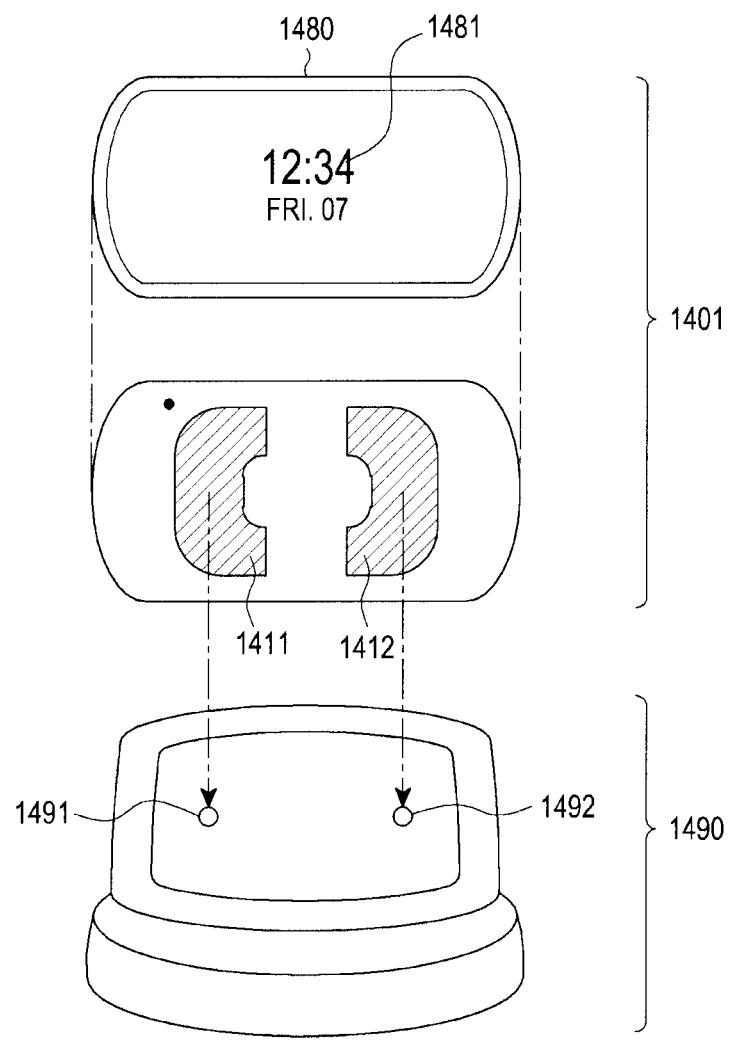

Referring to FIG. 14C, the electronic device 1401 may be put on the charger 1490 in the first direction.

When the electronic device 1401 is put on the charger 1490 in the first direction, the electronic device 1401 may identify the polarity of the voltages applied thereto. Also, the electronic device 1401 may display at least one object 1481 in a designated direction on the display 1480, where the designated direction is determined based on the identified polarities of the voltages.

Figure 14D:
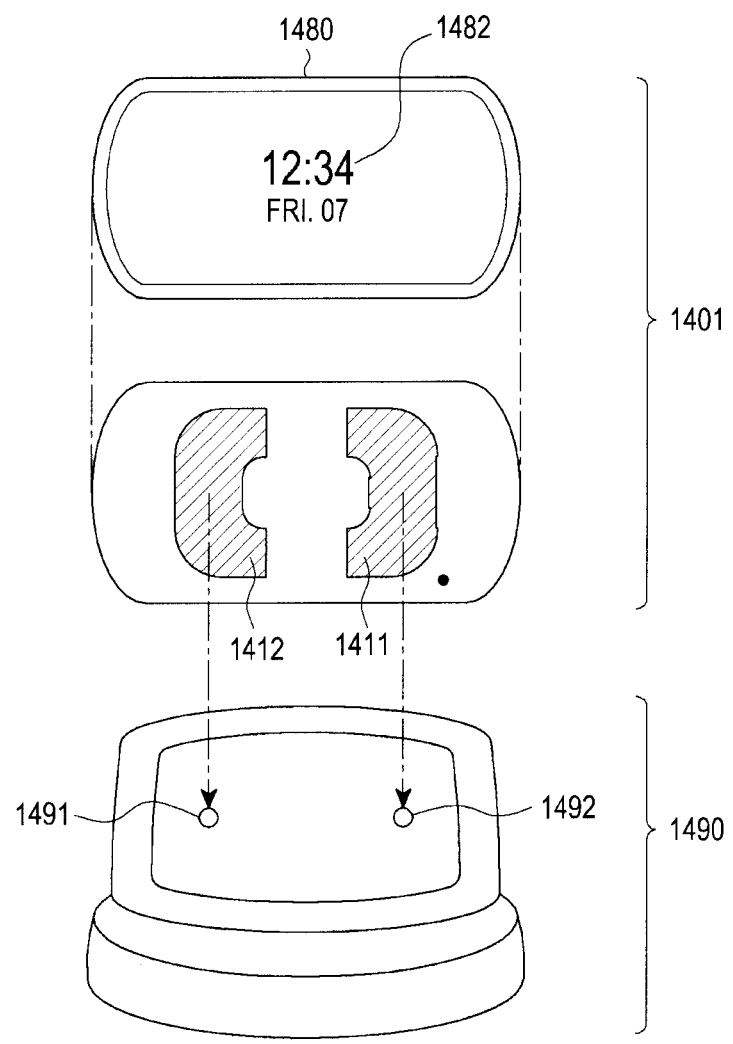

For example, the designated direction may be automatically determined by the processor 220, or may be determined by the user. As shown in FIGS. 14C-14D, the designated direction may be the direction to display the objects 1481 and 1482 so that the objects 1481 and 1482 can be properly read by the user, regardless of the orientation of the electronic device 1401 with respect to the charger 1490.

The electronic device 1401 may display at least one object 1481 in the designated direction on the basis of the polarity of the voltages applied to the first terminal 1411 and the second terminal 1412. For example, when a voltage applied to the first terminal 1411 is a positive voltage, and a voltage applied to the second terminal 1412 is a negative voltage, the electronic device 1401 may display at least one object 1481 on the display 1480 in an orientation corresponding to the case where the first terminal 1411 is located at the left side and the second terminal 1412 is located at the right side.

Referring to FIG. 14D, the electronic device 1401 may be put on the charger 1490 in the second direction.

When the electronic device 1401 is put on the charger 1490 in the second direction, the electronic device 1401 may identify the polarity of the voltages applied thereto. Also, the electronic device 1401 may display at least one object 1482 in the designated direction on the display 1480, where the designated direction is determined based on the identified polarities of the voltages.

The electronic device 1401 may display at least one object 1482 in the designated direction on the basis of the polarity of the voltages applied to the first terminal 1411 and the second terminal 1412. For example, when a voltage applied to the first terminal 1411 is a negative voltage, and a voltage applied to the second terminal 1412 is a positive voltage, the electronic device 1401 may display at least one object 1482 on the display 1480 in an orientation corresponding to the case where the first terminal 1411 is located at the right side and the second terminal 1412 is located at the left side.

Referring to FIGS. 14C and 14D, the electronic device 1401 may display at least one object in a designated direction regardless of the direction in which the electronic device 1401 is put on the charger 1490. For example, even when the electronic device 1401 is rotated from the first direction to the second direction, the electronic device 1401 may display the object in the same designated direction.

Figure 15:
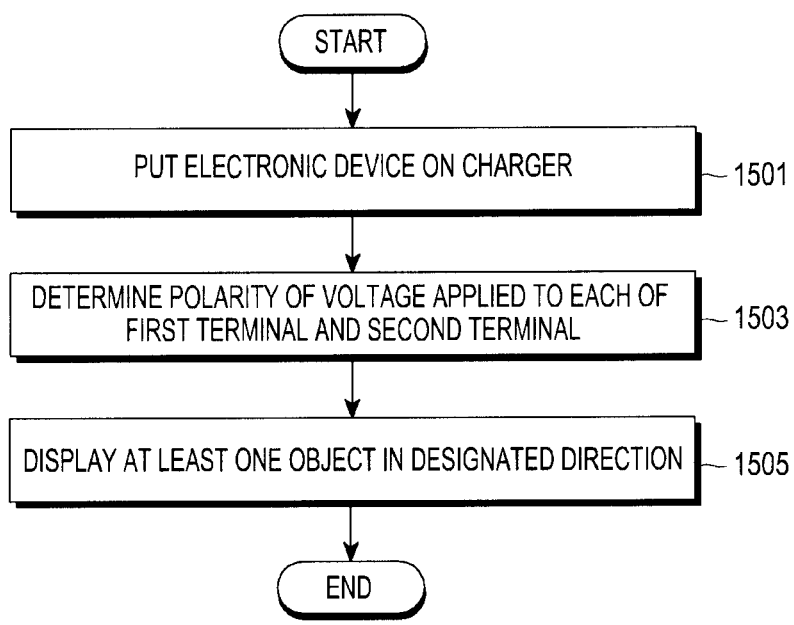
FIG. 15 is a flowchart for an operation of an electronic device according to an embodiment.

FIG. 15 is a flowchart for an operation of an electronic device according to an embodiment.

Referring to FIG. 15, an electronic device (e.g. the electronic device 201 in FIG. 2) may be put on the charger 290 in order to charge the battery 270 (operation 1501). For example, each of the terminals 211 and 212 included in the connection terminal part 210 of the electronic device 201 may be connected to one of the electrodes 291 and 292 included in the charger 290.

The electronic device 201 may identify the polarity of the voltage applied to each of the first terminal 211 and the second terminal 212 (operation 1503).

As explained in detail in connection with FIGS. 14A-14D, the electronic device 201 may display at least one object in a designated direction according to the polarity of the voltage applied to each of the first terminal 211 and the second terminal 212 (operation 1505). For example, the designated direction may be automatically determined by the processor 220, or may be determined by the user.

According to an embodiment, when the electronic device 201 is put on the charger 290, the electronic device 201 may execute a designated application and display at least one object in accordance with the executed application on the display 280. The object may be displayed in the designated direction on the display 280.

For example, when the electronic device 201 is put on the charger 290, the electronic device 201 may execute a clock application and display at least one object (e.g. a clock object indicating time) corresponding to the executed clock application on the display 280. The clock object may be displayed in the designated direction on the display 280. Accordingly, the electronic device 201 may be used as a table clock when the electronic device 201 is put on the charger 290.

A wearable device according to an embodiment may include: a housing forming at least a part of an exterior of the wearable device; a battery disposed in the housing and including a positive electrode terminal and a negative electrode terminal; a connection terminal part, at least a part of which is exposed through at least a part of the housing and including a first terminal and a second terminal; a bridge circuit configured to, based on a polarity of a first voltage applied to the first terminal, electrically connect the first terminal to one of the positive electrode terminal and the negative electrode terminal having polarity corresponding to the polarity of the first voltage, based on a polarity of a second voltage applied to the second terminal, electrically connect the second terminal to one of the positive electrode terminal and the negative electrode terminal having polarity corresponding to the polarity of the second voltage; a sensor module configured to obtain bio-information; and a switch circuit configured to selectively connect the connection terminal part with the bridge circuit and the sensor module.

The wearable device may further include: a first switch configured to selectively connect the first terminal to the positive electrode terminal or the negative electrode terminal; and a second switch configured to selectively connect the second terminal to the positive electrode terminal or the negative electrode terminal.

The wearable device may further include: a voltage sensing circuit; and a processor, wherein the processor may be configured to: identify the polarity of the first voltage and the polarity of the second voltage by using the voltage sensing circuit; connect the first terminal to one of the positive electrode terminal and the negative electrode terminal having polarity corresponding to the polarity of the first voltage through the first switch based on the polarity of the first voltage; and connect the second terminal to one of the positive electrode terminal and the negative electrode terminal having polarity corresponding to the polarity of the second voltage through the second switch based on the polarity of the second voltage.

The processor may be further configured to: identify a voltage of the battery; and connect the first switch and the second switch to the first terminal and the second terminal based on the identified voltage of the battery.

The bridge circuit may include: a first diode disposed between the first terminal and the positive electrode terminal; a second diode disposed between the first terminal and the negative electrode terminal; a third diode disposed between the second terminal and the positive electrode terminal; and a fourth diode disposed between the second terminal and the negative electrode terminal.

The first diode and the second diode may have opposite directionalities, and the third diode and the fourth diode may have opposite directionalities.

The wearable device may further include the processor, wherein the processor may be configured to: when a request for obtaining the bio-information is identified, connect the sensor module with the first terminal and the second terminal through the switch circuit.

The wearable device may further include the processor, wherein the processor may be configured to: when a request for charging the battery is identified, connect the bridge circuit with the first terminal and the second terminal through the switch circuit.

An electronic device according to an embodiment may include: a housing forming at least a part of an exterior of the electronic device; a battery disposed in the housing and including a positive electrode terminal and a negative electrode terminal; a connection terminal part, at least a part of which is exposed through at least a part of the housing and including a first terminal and a second terminal; and a bridge circuit configured to, based on a polarity of a first voltage applied to the first terminal, electrically connect the first terminal to one of the positive electrode terminal and the negative electrode terminal having polarity corresponding to the polarity of the first voltage, based on a polarity of a second voltage applied to the second terminal, electrically connect the second terminal to one of the positive electrode terminal and the negative electrode terminal having polarity corresponding to the polarity of the second voltage.

The electronic device may further include: a first switch configured to selectively connect the first terminal to the positive electrode terminal or the negative electrode terminal; and a second switch configured to selectively connect the second terminal to the positive electrode terminal or the negative electrode terminal.

The electronic device may further include: a voltage sensing circuit; and a processor, wherein the processor may be configured to: identify the polarity of the first voltage and the polarity of the second voltage using the voltage sensing circuit; connect the first terminal to one of the positive electrode terminal and the negative electrode terminal having polarity corresponding to the polarity of the first voltage through the first switch based on the polarity of the first voltage; and connect the second terminal to one of the positive electrode terminal and the negative electrode terminal having polarity corresponding to the polarity of the second voltage through the second switch based on the polarity of the second voltage.

The processor may be further configured to: identify a voltage of the battery; and connect the first switch and the second switch to the first terminal and the second terminal based on the identified voltage of the battery.

The bridge circuit may include: a first diode disposed between the first terminal and the positive electrode terminal; a second diode disposed between the first terminal and the negative electrode terminal; a third diode disposed between the second terminal and the positive electrode terminal; and a fourth diode disposed between the second terminal and the negative electrode terminal.

The first diode and the second diode may have opposite directionalities, and the third diode and the fourth diode may have opposite directionalities.

The electronic device may further include a display, wherein the processor may display at least one object on the display in a designated direction, wherein the designated direction is determined based on the polarity of the first voltage and the polarity of the second voltage.

The electronic device may be implemented as a wearable device.

An operation method of an electronic device according to an embodiment may include: determining whether to a request to charge the electronic device or a request to obtain bio-information by using the electronic device is received; when the request to obtain the bio-information is received, controlling a switch circuit so as to connect a connection terminal part of the electronic device to a sensor module; when the request to charge the electronic device is received, controlling the switch circuit so as to connect the connection terminal part of the electronic device to a charging circuit; when the request to charge the electronic device is received, through a bridge circuit of the charging circuit and based on a polarity of a first voltage applied to a first terminal of the connection terminal part, electrically connecting the first terminal of the connection terminal part to one of a positive electrode terminal and a negative electrode terminal of a battery having polarity corresponding to the polarity of the first voltage, wherein the battery is included in the electronic device; and when the request to charge the electronic device is received, through a bridge circuit of the charging circuit and based on a polarity of a second voltage applied to a second terminal of the connection terminal part, electrically connecting the second terminal of the connection terminal part to one of the positive electrode terminal and the negative electrode terminal having polarity corresponding to the polarity of the second voltage.

The operation method of the electronic device may further include: identifying the polarity of the first voltage and the polarity of the second voltage by using a voltage sensing circuit included in the electronic device; connecting the first terminal to one of the positive electrode terminal and the negative electrode terminal having polarity corresponding to the polarity of the first voltage through a first switch of the electronic device based on the polarity of the first voltage; and connecting the second terminal to one of the positive electrode terminal and the negative electrode terminal having polarity corresponding to the polarity of the second voltage through a second switch of the electronic device based on the polarity of the second voltage.

The identifying of the polarity of the first voltage and the polarity of the second voltage may include: identifying a voltage of the battery; and based on the identified voltage of the battery, determining whether to identify the polarity of the first voltage and the polarity of the second voltage.

The operation method of the electronic device may further include: displaying at least one object on a display of the electronic device in a designated direction, wherein the designated direction is determined based on the polarity of the first voltage and the polarity of the second voltage.

Each of the elements of the electronic device disclosed herein may be implemented by one or more components and the names of the corresponding elements may vary depending on the type of the electronic device. In various embodiments, the electronic device may include at least one of the above-described elements. Some of the above-described elements may be omitted from the electronic device, or the electronic device may further include additional elements. Further, some of the elements of the electronic device according to the various embodiments may be combined to form a single entity, and thus, may equivalently execute functions of the corresponding elements prior to the combination.

Certain aspects of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

Various embodiments disclosed herein are provided merely to easily describe technical details in the present disclosure and to help the understanding of the present disclosure, and are not intended to limit the scope of the present disclosure. Therefore, it should be construed that various other embodiments or all modifications based on the technical idea of the present disclosure fall within the scope of the present disclosure.

What is claimed is:

1. A wearable device, comprising:
   a housing forming at least a part of an exterior of the wearable device;
   a battery disposed in the housing and including a positive electrode terminal and a negative electrode terminal;
   a connection terminal part, at least a part of which is exposed through at least a part of the housing, and including a first terminal and a second terminal;
   a bridge circuit configured to:
      based on a polarity of a first voltage applied to the first terminal, electrically connect the first terminal to one of the positive electrode terminal and the negative electrode terminal having polarity corresponding to the polarity of the first voltage,
      based on a polarity of a second voltage applied to the second terminal, electrically connect the second terminal to one of the positive electrode terminal and the negative electrode terminal having polarity corresponding to the polarity of the second voltage;
   a sensor module configured to obtain bio-information; and
   a switch circuit configured to selectively connect the connection terminal part with the bridge circuit or the sensor module.

2. The wearable device of claim 1, further comprising:
   a first switch configured to selectively connect the first terminal to the positive electrode terminal or the negative electrode terminal; and
   a second switch configured to selectively connect the second terminal to the positive electrode terminal or the negative electrode terminal.

3. The wearable device of claim 2, further comprising:
   a voltage sensing circuit; and
   a processor,
   wherein the processor is configured to:
      identify the polarity of the first voltage and the polarity of the second voltage by using the voltage sensing circuit;
      connect the first terminal to one of the positive electrode terminal and the negative electrode terminal having polarity corresponding to the polarity of the first voltage through the first switch based on the polarity of the first voltage; and
      connect the second terminal to one of the positive electrode terminal and the negative electrode terminal having polarity corresponding to the polarity of the second voltage through the second switch based on the polarity of the second voltage.

4. The wearable device of claim 3, wherein the processor is further configured to:
   identify a voltage of the battery; and
   connect the first switch and the second switch to the first terminal and the second terminal based on the identified voltage of the battery.

5. The wearable device of claim 1, wherein the bridge circuit comprises:
   a first diode disposed between the first terminal and the positive electrode terminal;
   a second diode disposed between the first terminal and the negative electrode terminal;
   a third diode disposed between the second terminal and the positive electrode terminal; and
   a fourth diode disposed between the second terminal and the negative electrode terminal.

6. The wearable device of claim 5, wherein the first diode and the second diode have opposite directionalities, and the third diode and the fourth diode have opposite directionalities.

7. The wearable device of claim 1, further comprising a processor, wherein the processor is configured to, when a request for obtaining the bio-information is identified, connect the sensor module with the first terminal and the second terminal through the switch circuit.

8. The wearable device of claim 1, further comprising a processor,
wherein the processor is configured to, when a request for charging the battery is identified, connect the bridge circuit with the first terminal and the second terminal through the switch circuit.

9. An electronic device, comprising:
a housing forming at least a part of an exterior of the electronic device;
a battery disposed in the housing and including a positive electrode terminal and a negative electrode terminal;
a connection terminal part, at least a part of which is exposed through at least a part of the housing, and including a first terminal and a second terminal; and
a bridge circuit configured to:
based on a polarity of a first voltage applied to the first terminal, electrically connect the first terminal to one of the positive electrode terminal and the negative electrode terminal having polarity corresponding to the polarity of the first voltage, and
based on a polarity of a second voltage applied to the second terminal, electrically connect the second terminal to one of the positive electrode terminal and the negative electrode terminal having polarity corresponding to the polarity of the second voltage.

10. The electronic device of claim 9, further comprising:
a first switch configured to selectively connect the first terminal to the positive electrode terminal or the negative electrode terminal; and
a second switch configured to selectively connect the second terminal to the positive electrode terminal or the negative electrode terminal.

11. The electronic device of claim 10, further comprising:
a voltage sensing circuit; and
a processor,
wherein the processor is configured to:
identify the polarity of the first voltage and the polarity of the second voltage using the voltage sensing circuit;
connect the first terminal to one of the positive electrode terminal and the negative electrode terminal having polarity corresponding to the polarity of the first voltage through the first switch based on the polarity of the first voltage; and
connect the second terminal to one of the positive electrode terminal and the negative electrode terminal having polarity corresponding to the polarity of the second voltage through the second switch based on the polarity of the second voltage.

12. The electronic device of claim 11, wherein the processor is further configured to:
identify a voltage of the battery; and
connect the first switch and the second switch to the first terminal and the second terminal based on the identified voltage of the battery.

13. The electronic device of claim 9, wherein the bridge circuit comprises:
a first diode disposed between the first terminal and the positive electrode terminal;
a second diode disposed between the first terminal and the negative electrode terminal;
a third diode disposed between the second terminal and the positive electrode terminal; and
a fourth diode disposed between the second terminal and the negative electrode terminal.

14. The electronic device of claim 13, wherein the first diode and the second diode have opposite directionalities, and the third diode and the fourth diode have opposite directionalities.

15. The electronic device of claim 11, further comprising a display,
wherein the processor is further configured to display at least one object on the display in a designated direction, wherein the designated direction is determined based on the polarity of the first voltage and the polarity of the second voltage.

16. The electronic device of claim 9, wherein the electronic device is a wearable device.

17. An operation method of an electronic device, comprising:
determining whether to a request to charge the electronic device or a request to obtain bio-information by using the electronic device is received;
when the request to obtain the bio-information is received, controlling a switch circuit so as to connect a connection terminal part of the electronic device to a sensor module;
when the request to charge the electronic device is received, controlling the switch circuit so as to connect the connection terminal part of the electronic device to a charging circuit;
when the request to charge the electronic device is received, through a bridge circuit of the charging circuit and based on a polarity of a first voltage applied to a first terminal of the connection terminal part, electrically connecting the first terminal of the connection terminal part to one of a positive electrode terminal and a negative electrode terminal of a battery having polarity corresponding to the polarity of the first voltage, wherein the battery is included in the electronic device; and
when the request to charge the electronic device is received, through a bridge circuit of the charging circuit and based on a polarity of a second voltage applied to a second terminal of the connection terminal part, electrically connecting the second terminal of the connection terminal part to one of the positive electrode terminal and the negative electrode terminal having polarity corresponding to the polarity of the second voltage.

18. The operation method of claim 17, further comprising:
identifying the polarity of the first voltage and the polarity of the second voltage by using a voltage sensing circuit included in the electronic device;
connecting the first terminal to one of the positive electrode terminal and the negative electrode terminal having polarity corresponding to the polarity of the first voltage through a first switch of the electronic device based on the polarity of the first voltage; and
connecting the second terminal to one of the positive electrode terminal and the negative electrode terminal having polarity corresponding to the polarity of the second voltage through a second switch of the electronic device based on the polarity of the second voltage.

19. The operation method of claim 18, wherein the identifying of the polarity of the first voltage and the polarity of the second voltage further comprises:

identifying a voltage of the battery; and based on the identified voltage of the battery, determining whether to identify the polarity of the first voltage and the polarity of the second voltage.

20. The operation method of claim 18, further comprising:

displaying at least one object on a display of the electronic device in a designated direction, wherein the designated direction is determined based on the polarity of the first voltage and the polarity of the second voltage.

* * * * *